US012677406B2

(12) United States Patent
Chen et al.

(10) Patent No.: US 12,677,406 B2
(45) Date of Patent: Jul. 7, 2026

(54) MEMORY DEVICE AND MANUFACTURING METHOD THEREOF

(71) Applicant: Yangtze Memory Technologies Co., Ltd., Wuhan (CN)

(72) Inventors: He Chen, Wuhan (CN); Ziqun Hua, Wuhan (CN); Hongbin Zhu, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 622 days.

(21) Appl. No.: 18/082,291

(22) Filed: Dec. 15, 2022

(65) Prior Publication Data

US 2024/0196589 A1      Jun. 13, 2024

(30) Foreign Application Priority Data

Dec. 9, 2022    (CN) .......................... 202211586487.7

(51) Int. Cl.
H10B 12/00        (2023.01)
(52) U.S. Cl.
CPC ........... H10B 12/05 (2023.02); H10B 12/315 (2023.02)

(58) Field of Classification Search
CPC .............................. H10B 43/27; H10B 12/315
See application file for complete search history.

(56) References Cited

U.S. PATENT DOCUMENTS

| | | | | |
|---|---|---|---|---|
| 9,570,462 B2 * | 2/2017 | Lee | ......................... | H10B 43/27 |
| 2005/0280061 A1 * | 12/2005 | Lee | ...................... | H10B 12/315 |
| | | | | 257/296 |
| 2019/0067298 A1 * | 2/2019 | Karda | ................... | G11C 11/408 |
| 2023/0066312 A1 * | 3/2023 | Zhu | ........................ | H10B 41/27 |

* cited by examiner

*Primary Examiner* — Steven M Page
(74) *Attorney, Agent, or Firm* — Anova Law Group, PLLC

(57) ABSTRACT
A method of forming a memory device including providing a base wafer that includes a substrate, an insulation layer over the substrate, a sacrificial layer over the insulation layer, and a plurality of channel layers embedded in the sacrificial layer and the insulation layer, forming a plurality of grooves in the sacrificial layer each exposing a portion of the insulation layer and separating two adjacent rows of the channel layers, filling the plurality of grooves with an insulation material to form a plurality of spacers, removing the sacrificial layer to form a plurality of trenches that expose portions of the insulation layer and a portion of a sidewall of each of the channel layers, and forming a plurality of gate layers in the trenches.

4 Claims, 36 Drawing Sheets

<u>1200</u>

140

130

120

110

211

140

130

120

110

211

140

130

120

110

211

130

221

230

240

251

252

131

310

1300

1400

MEMORY DEVICE AND MANUFACTURING METHOD THEREOF

CROSS-REFERENCE TO RELATED APPLICATION

This application claims the priority to Chinese Patent Application No. 202211586487.7, filed on Dec. 9, 2022, the content of which is incorporated herein by reference in its entirety.

FIELD OF THE TECHNOLOGY

This application relates to the field of memory devices and, more particularly, to a dynamic random-access memory device and manufacturing method thereof.

BACKGROUND OF THE DISCLOSURE

Memory devices, such as dynamic random-access memory (DRAM) devices, are widely used in smartphones, tablets, laptops, desktop computers, data servers, or other computational devices. New DRAM structures have been developed to overcome the inherent scaling limitations and to improve the cost effectiveness of mass production. One of these structures is a DRAM device with a vertical-channel transistor structure. Such a DRAM device has the advantage of significantly reducing the chip area compared with a conventional DRAM.

The process of forming a vertical-channel DRAM device includes depositing an oxide-nitride-oxide (ONO) composite layer over a substrate, etching the ONO composite layer to form a plurality of openings that penetrate the ONO composite layer, depositing polysilicon in the plurality of openings to form channel layers, removing the nitride layer in the ONO composite layer, and forming a gate structure surrounding each channel. However, with this process, because the gate structures are formed on sidewalls of the plurality of channel layers, it is difficult to form word lines to connect the plurality of gate structures. As a result, the formed word lines are prone to breaking and/or have high resistance, causing a large resistive-capacitive delay and affecting the performance of the final device.

SUMMARY

In accordance with the disclosure, there is provided a method of forming a memory device including providing a base wafer that includes a substrate, an insulation layer over the substrate, a sacrificial layer over the insulation layer, and a plurality of channel layers embedded in the sacrificial layer and the insulation layer. The method further includes forming a plurality of grooves in the sacrificial layer. Each of the plurality of grooves exposes a portion of the insulation layer and separates two adjacent rows of the channel layers. The method also includes filling the plurality of grooves with an insulation material to form a plurality of spacers, removing the sacrificial layer to form a plurality of trenches that expose portions of the insulation layer and a portion of a sidewall of each of the channel layers, and forming a plurality of gate layers in the trenches.

Also in accordance with the disclosure, there is provided a memory device including a substrate, a plurality of channel layers formed over the substrate and forming an array expanding in a first direction and a second direction different from each other and parallel to a surface of the substrate, a plurality of gate dielectric layers each surrounding one of the channel layers, a plurality of gate layers arranged along the first direction and each continuously extending approximately along the second direction and surrounding one column of the channel layers, and a plurality of spacers arranged along the first direction. Each of the spacers extends approximately along the second direction and separates neighboring ones of the gate layers.

Also in accordance with the disclosure, there is provided a memory system including a memory device and a memory controller coupled to the memory device and configured to control operation of the memory device. The memory device includes a substrate, a plurality of channel layers formed over the substrate and forming an array expanding in a first direction and a second direction different from each other and parallel to a surface of the substrate, a plurality of gate dielectric layers each surrounding one of the channel layers, a plurality of gate layers arranged along the first direction and each continuously extending approximately along the second direction and surrounding one column of the channel layers, and a plurality of spacers arranged along the first direction. Each of the spacers extends approximately along the second direction and separates neighboring ones of the gate layers.

DESCRIPTION OF EMBODIMENTS

Figure 1:
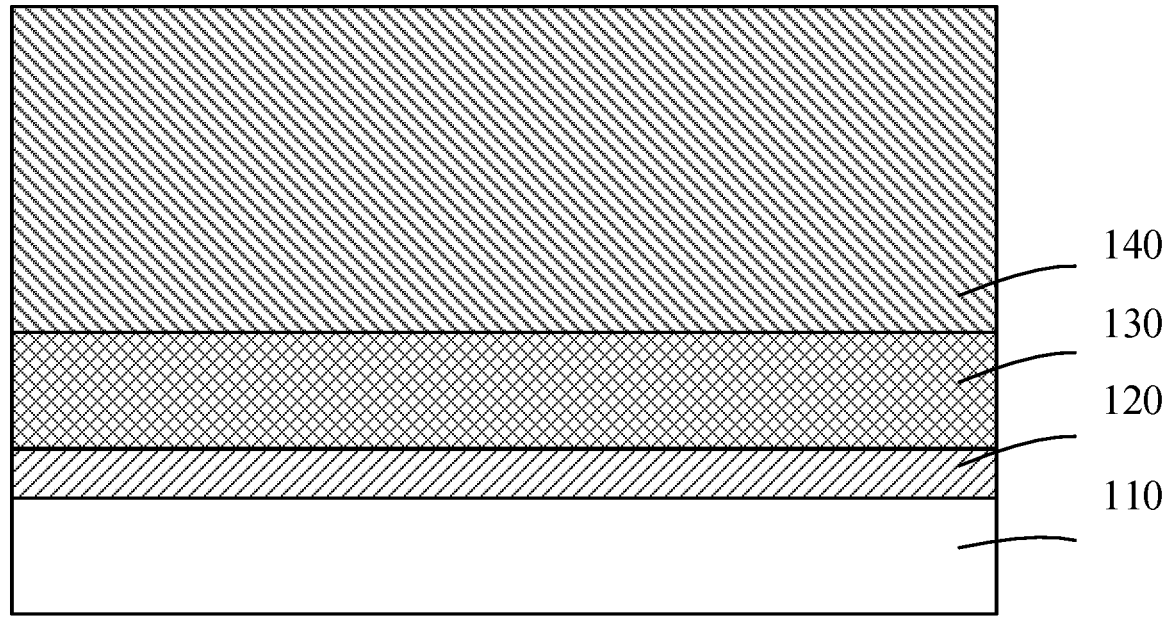
FIGS. 1-12C schematically show a process of fabricating a memory device consistent with embodiments of the disclosure.

The following describes the technical solutions in the embodiments of the present disclosure with reference to the accompanying drawings. Wherever possible, the same reference numbers will be used throughout the drawings to refer to the same or like parts. The described embodiments are merely some but not all of the embodiments of the present disclosure. Other embodiments obtained by a person skilled in the art based on the embodiments of the present disclosure without creative efforts shall fall within the scope of the present disclosure.

Unless otherwise defined, all the technical and scientific terms used herein have the same or similar meanings as generally understood by one of ordinary skill in the art. As described herein, the terms used in the specification of the present disclosure are intended to describe example embodiments, instead of limiting the present disclosure.

As used herein, when a first component is referred to as "fixed to" a second component, it is intended that the first component can be directly attached to the second component or can be indirectly attached to the second component via another component. When a first component is referred to as "connecting" to a second component, it is intended that the first component can be directly connected to the second component or can be indirectly connected to the second component via a third component between them. The terms "vertical," "horizontal," "perpendicular," "left," "right," and similar expressions used herein, are merely intended for purposes of description. The term "and/or" used herein includes any suitable combination of one or more related items listed.

In this disclosure, a value or a range of values can refer to a desired, target, or nominal value or range of values and can include slight variations. The term "about" or "approximately" associated with a value can allow a variation within, for example, 10% of the value, such as ±2%, ±5%, or ±10% of the value, or another proper variation as appreciated by one of ordinary skill in the art. The term "about" or "approximately" associated with a state can allow a slight deviation from the state. For example, a first component being approximately perpendicular to a second component can indicate that the first component is either exactly perpendicular to the second component or slightly deviates from being perpendicular to the second component, and an angle between the first and second components can be within a range from, e.g., 80° to 100°, or another proper range as appreciated by one of ordinary skill in the art.

FIGS. 1-12C schematically show an example process of fabricating a memory device consistent with embodiments of the disclosure, which will be described in more detail below. The steps in the fabrication process are described below in a certain order. This, however, does not necessarily mean the steps must be performed in such an order. The order of certain steps can be different from that in the description below, and some steps can be performed simultaneously. Further, not all steps must be included in the fabrication process, and some steps can be omitted.

FIG. 1 is a cross-sectional view schematically showing a structure at a certain stage of the process of forming the memory device. As shown in FIG. 1, a first substrate 110 is provided. A first sacrificial layer 120, a first insulation layer 130, and a second sacrificial layer 140 are sequentially formed over the first substrate 110.

The first substrate 110 is also referred to as a "growth substrate" or a "sacrificial substrate," and can be made of, e.g., an elemental semiconductor material such as silicon or germanium, a semiconductor alloy such as SiGe, a compound semiconductor material such as SiC, InP, GaAs, GaP, InAs, InSb, InGaAs, or InGaAsP, or a composite material such as silicon-on-insulator (SOI) or germanium-on-insulator (GOI), or a combination of any of the above materials.

In some embodiments, the first sacrificial layer 120 can be made of an insulation material such as silicon nitride, the first insulation layer 130 can be made of an insulation material such as silicon oxide, and the second sacrificial layer 140 can be made of an insulation material such as silicon nitride. In some other embodiments, other materials can be chosen for these layers. Conditions for selecting the materials can include, for example, a high etching selectivity between the material for the first sacrificial layer 120 and the material for the first insulation layer 130 and a high etching selectivity between the material for the first insulation layer 130 and the second sacrificial layer 140. Further, the material for the first sacrificial layer 120 and the material for the second sacrificial layer 140 can be the same or different.

Figure 2A:
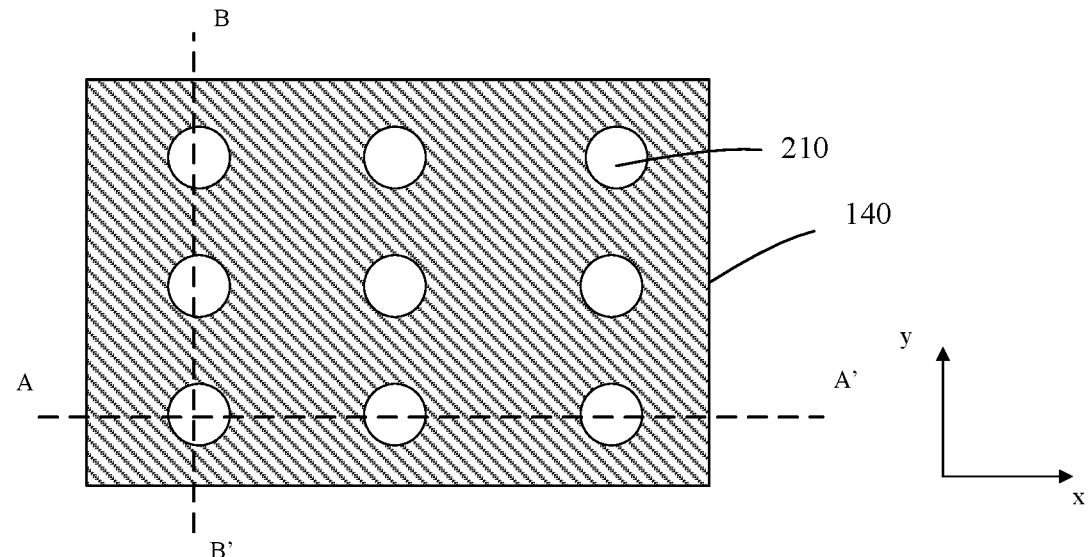
Figure 2B:
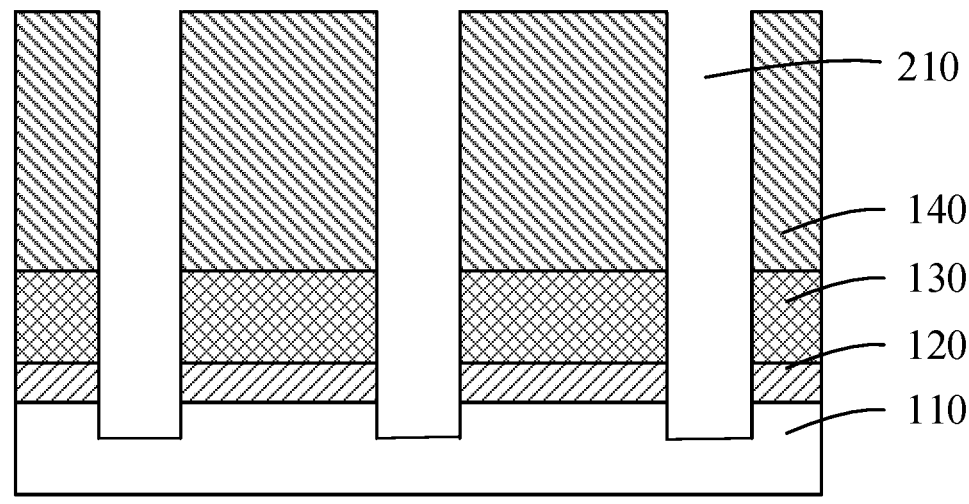
Figure 2C:
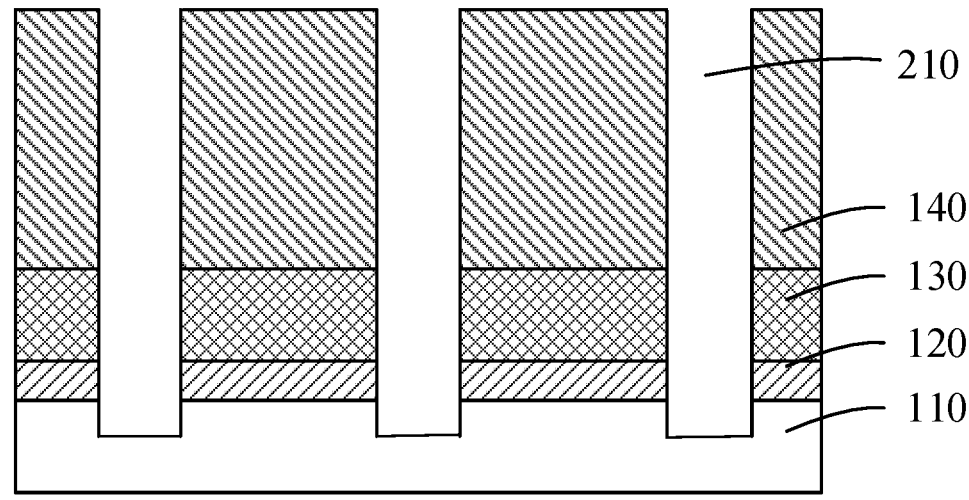

FIGS. 2A-2C schematically show a next stage in the fabrication process of the memory device. FIG. 2A is a top view, FIG. 2B is a cross-sectional view along A-A' line in FIG. 2A, and FIG. 2C is a cross-sectional view along B-B' line in FIG. 2A. As shown in FIGS. 2A and 2B, a plurality of openings 210 (also referred to as "channel holes") are formed in the second sacrificial layer 140, the first insulation layer 130, and the first sacrificial layer 120. In the example shown in FIG. 2A, each opening 210 has a circular shape in the top view. In some other embodiments, the openings 210 can have another shape, such as square or rectangle.

The plurality of openings 210 can be arranged in an array expanding along a first direction and a second direction different from the first direction. That is, the plurality of openings 210 can be considered as including one or more columns of openings 210 arranged along the first direction and each extending in the second direction; or the plurality of openings 210 can be considered as including one or more rows of openings 210 arranged along the second direction and each extending in the first direction.

An angle between the first direction and the second direction can be non-zero. In some embodiments, the angle between the first direction and the second direction can be approximately 90°, i.e., the first direction can be approximately perpendicular to the second direction. In the embodiments described below in connection with FIGS. 2A-12C, the first direction and the second direction are approximately perpendicular to each other, with the first direction being denoted as an x-direction and the second direction being denoted as a y-direction, such as shown in FIG. 2A. The first direction can be, e.g., a bit line direction in the memory device and the second direction can be, e.g., a word line direction in the memory device.

The plurality of openings 210 can penetrate through the second sacrificial layer 140 and the first insulation layer 130. In some embodiments, the plurality of openings 210 can also penetrate through the first sacrificial layer 120 to expose portions of a top surface of the first substrate 110 or extend further into the first substrate 110, as shown in FIGS. 2B and 2C. In some other embodiments, the plurality of openings 210 can only partially extend into the first sacrificial layer 120 without penetrating therethrough and without exposing the top surface of the first substrate 110.

The plurality of openings 210 can be formed by photolithography and etching (wet etching or dry etching), and the etching process can include several selective etching processes. For example, different etchants can be used to etch the second sacrificial layer 140, the first insulation layer 130, and the first sacrificial layer 120. As another example, a same etchant having effect on all these three layers can be used to etch them and form the plurality of openings 210 in one etching step.

Figure 3A:
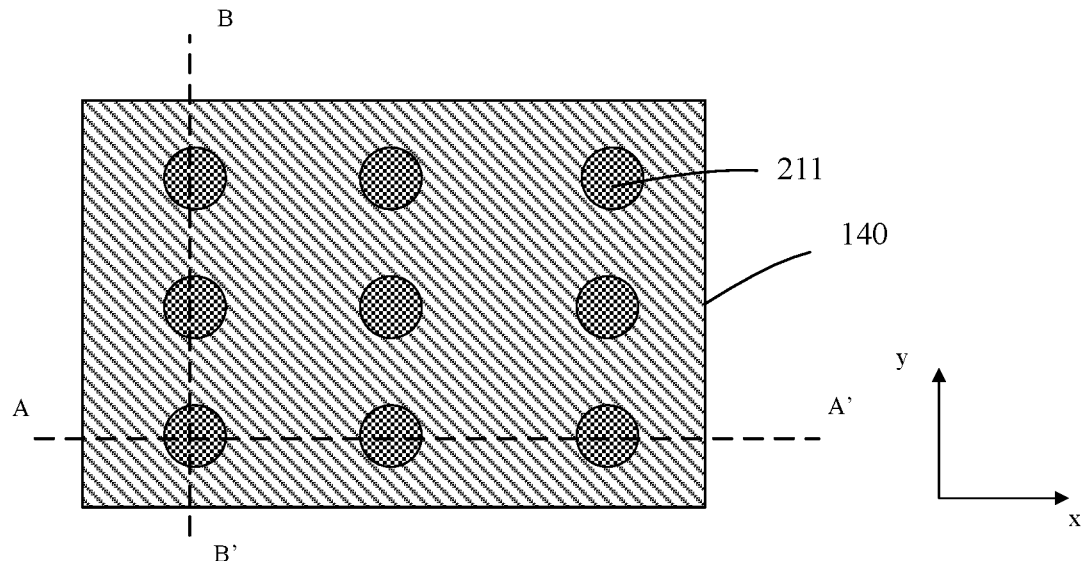
Figure 3B:
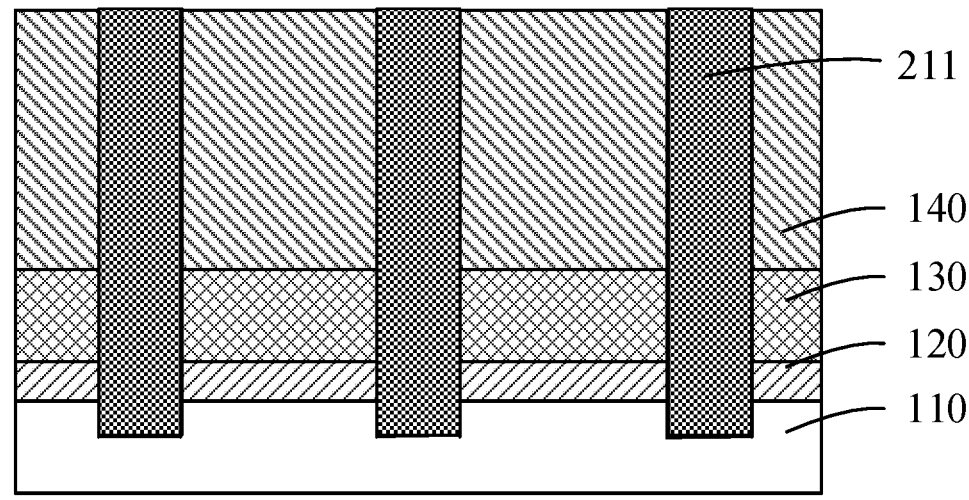
Figure 3C:
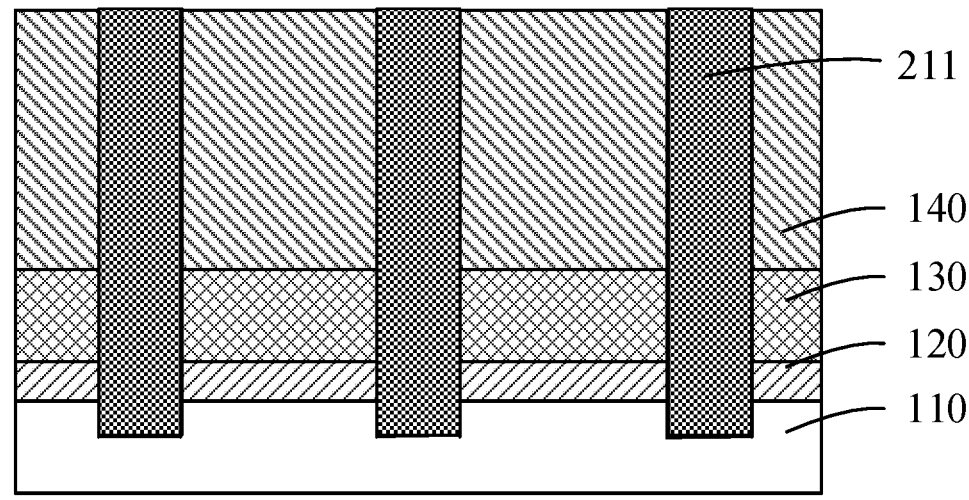

FIGS. 3A-3C schematically show a next stage in the fabrication process of the memory device. FIG. 3A is a top view, FIG. 3B is a cross-sectional view along A-A' line in FIG. 3A, and FIG. 3C is a cross-sectional view along B-B' line in FIG. 3A. As shown in FIGS. 3A-3C, channel layers 211 are formed in the plurality of openings 210. The channel layers 211 can be made of a conductive material, such as polycrystalline silicon (polysilicon) and the polycrystalline silicon can be doped with, e.g., n-type dopant. Various methods can be used to form the channel layers 211. For example, as shown in FIGS. 2A-2C, the openings 210 expose portions of the top surface of the first substrate 110. In this scenario, selective epitaxial growth can be used to grow polysilicon as the channel material over the exposed portions of the top surface of the first substrate 110 and fill the openings 210 to form the channel layers 211.

In some embodiments, a planarization process, such as etching or chemical-mechanical polishing (CMP), can be performed to remove excess channel material such that top surfaces of the channel layers 211 flush with a top surface of the second sacrificial layer 140, as shown in FIGS. 3B and 3C. In some other embodiments, the top surfaces of the channel layers 211 do not flush with the top surface of the second sacrificial layer 140 and can be higher or lower than the top surface of the second sacrificial layer 140. In this disclosure, the structure formed so far can also be referred to as a "base wafer," which can include, e.g., one or more of the first substrate 110, the first sacrificial layer 120, the first insulation layer 130, the second sacrificial layer 140, and the plurality of channel layers 211.

Figure 4A:
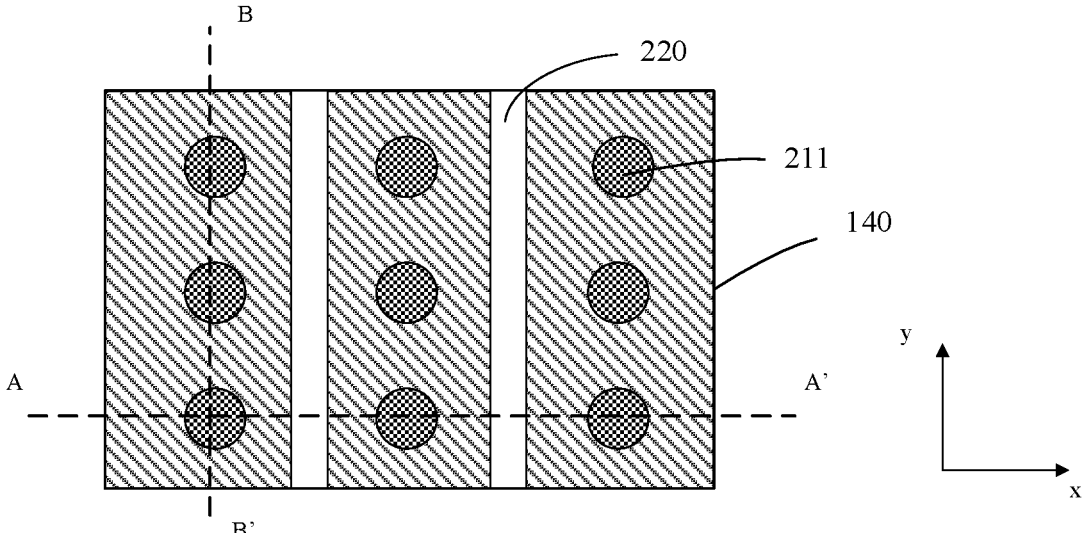
Figure 4B:
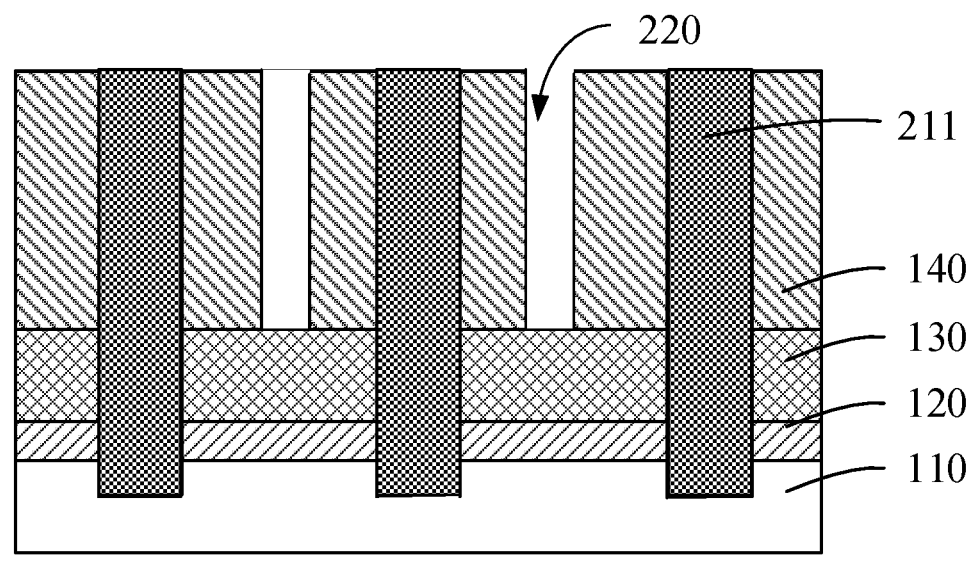
Figure 4C:
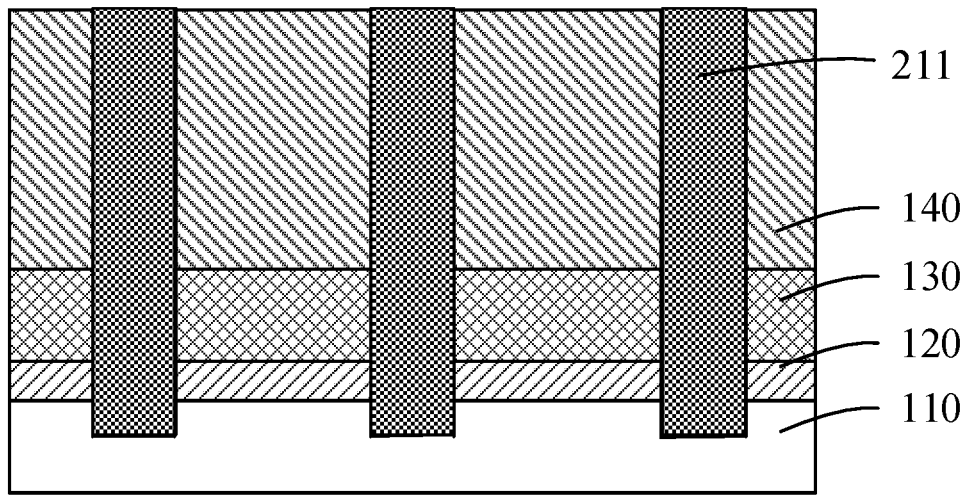

FIGS. 4A-4C schematically show a next stage in the fabrication process of the memory device. FIG. 4A is a top view, FIG. 4B is a cross-sectional view along A-A' line in FIG. 4A, and FIG. 4C is a cross-sectional view along B-B' line in FIG. 4A. As shown in FIGS. 4A-4C, a plurality of grooves 220 are formed in the second sacrificial layer 140.

As shown in FIGS. 4A and 4B, the plurality of grooves 220 are approximately parallel to each other and are arranged along the first direction. Each of the plurality of grooves 220 can extend along the second direction and separate adjacent columns of channel layers 211.

As shown in FIG. 4B, the plurality of grooves 220 can penetrate through the second sacrificial layer 140 to expose portions of a top surface of the first insulation layer 130. In some embodiments, the plurality of grooves 220 can slightly extend into the first insulation layer 130.

The plurality of grooves 220 can be formed by a dry etching method or a wet etching method. In some embodiments, the etchant used to form the plurality of grooves 220 can have a high etching selectivity on the material of the second sacrificial layer 140 over the material of the first insulation layer 130 so that the etching can properly stop at the top surface of the first insulation layer 130 to expose portions thereof.

Figure 5A:
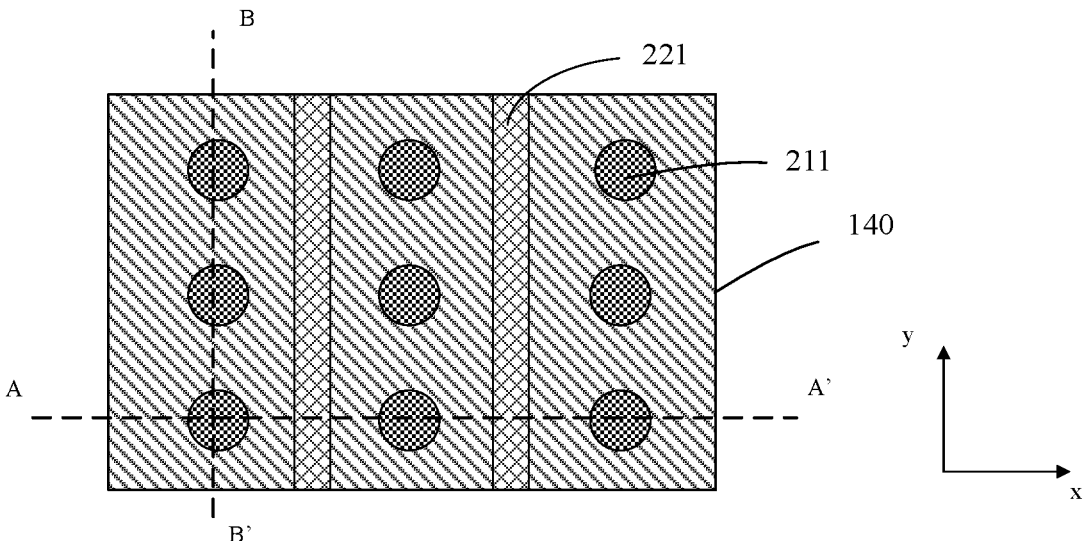
Figure 5B:
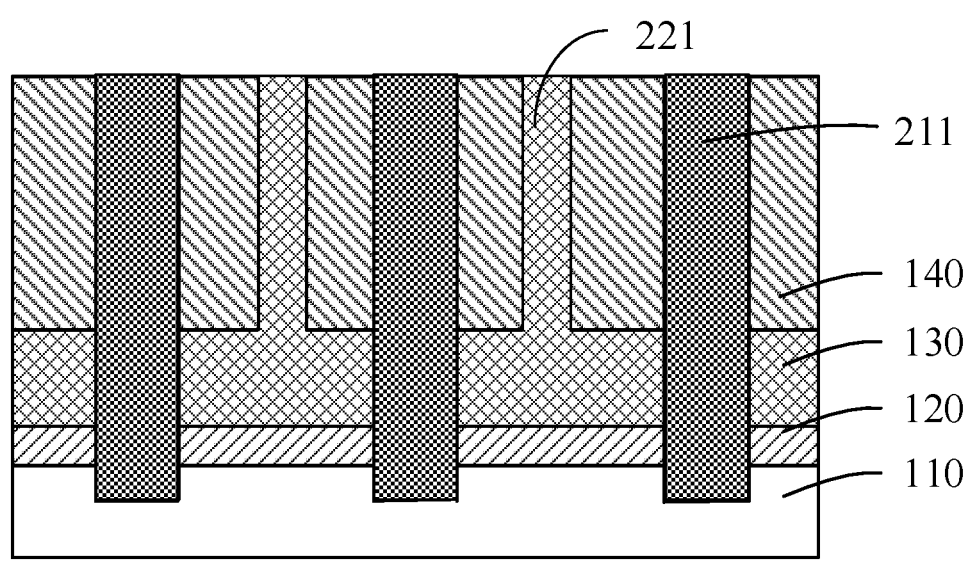
Figure 5C:
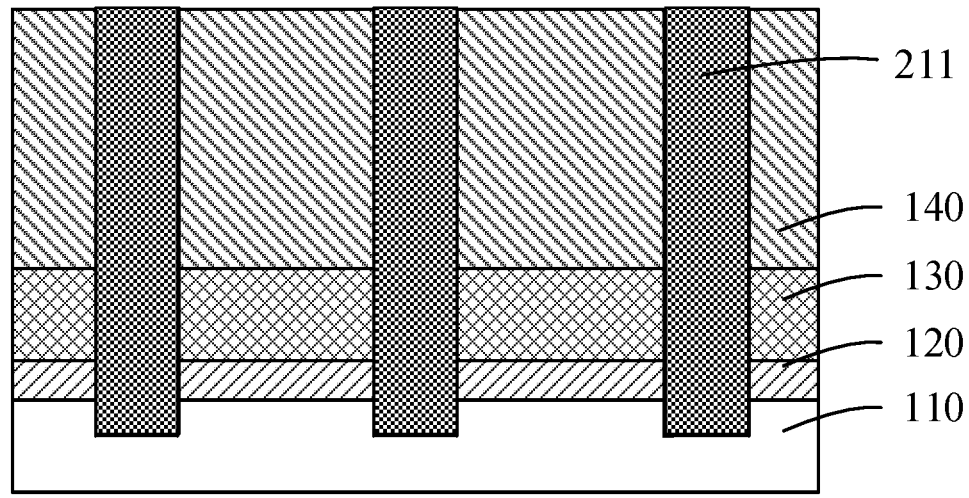

FIGS. 5A-5C schematically show a next stage in the fabrication process of the memory device. FIG. 5A is a top view, FIG. 5B is a cross-sectional view along A-A' line in FIG. 5A, and FIG. 5C is a cross-sectional view along B-B' line in FIG. 5A. As shown in FIGS. 5A and 5B, spacers 221 are formed in the plurality of grooves 220. In some embodiments, such as in the example shown in FIGS. 5A and 5B, the spacers 221 can be made of a material same as the material for the first insulation layer 130, such as silicon oxide, and can be formed by, e.g., a physical vapor deposition (PVD) method, a chemical vapor deposition (CVD) method, or an atomic layer deposition (ALD) method.

In some embodiments, a planarization process, such as etching or chemical-mechanical polishing (CMP), can be performed to remove excess channel material such that top surfaces of the spacers 221 flush with the top surface of the second sacrificial layer 140 as well as the top surfaces of the channel layers 211. In some other embodiments, the top surfaces of the spacers 221 do not flush with the top surface of the second sacrificial layer 140 and can be higher or lower than the top surface of the second sacrificial layer 140.

Figure 6A:
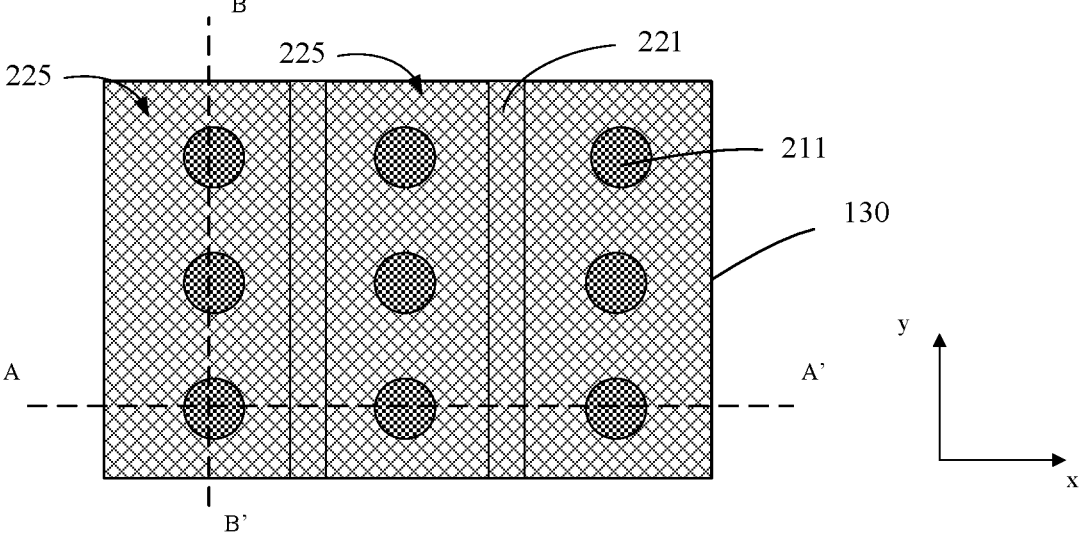
Figure 6B:
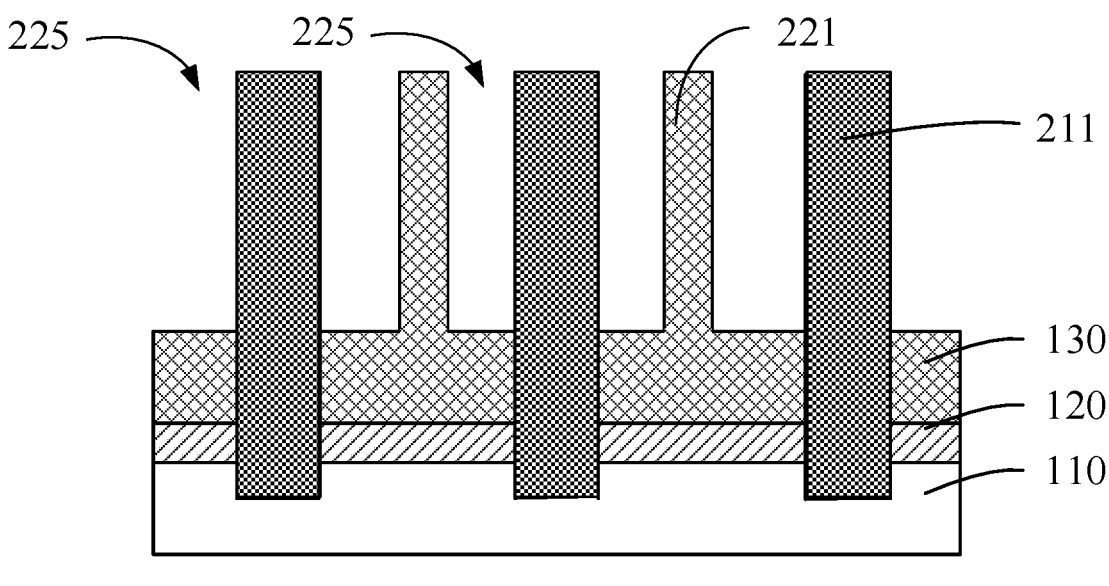
Figure 6C:
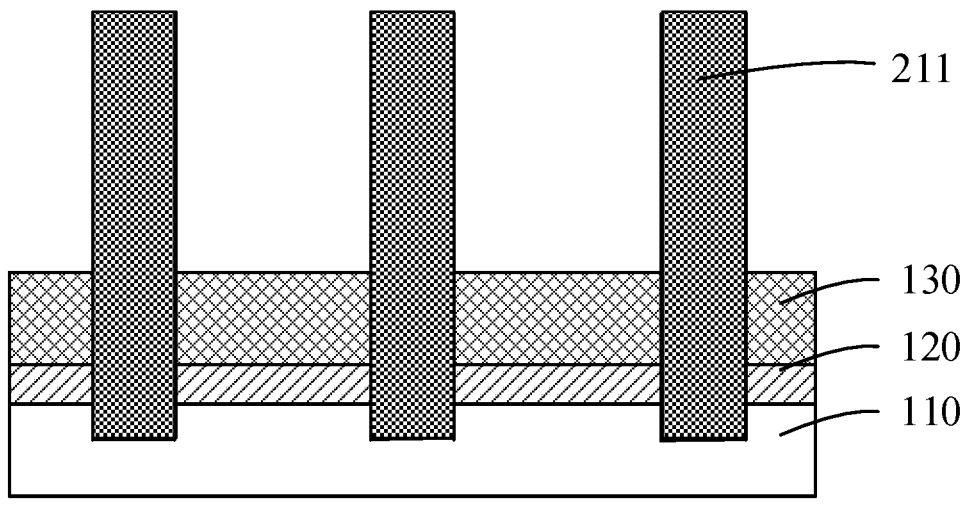

FIGS. 6A-6C schematically show a next stage in the fabrication process of the memory device. FIG. 6A is a top view, FIG. 6B is a cross-sectional view along A-A' line in FIG. 6A, and FIG. 6C is a cross-sectional view along B-B' line in FIG. 6A. As shown in FIGS. 6A-6C, the second sacrificial layer 140 is removed to expose the top surface of the first insulation layer 130 and a portion of each side surface of each channel layer 211. The second sacrificial layer 140 can be removed by, e.g., dry etching, wet etching, or ashing. As shown in FIGS. 6A and 6B, removal of the second sacrificial layer 140 forms a plurality of trenches 225 arranged along the first direction and separated from each other by the spacers 221. Each of the trenches 225 extends approximately along the second direction. Each of the plurality of channel layers 211 is located in one trench 225 and protrudes from a bottom of the one trench 225.

Figure 7A:
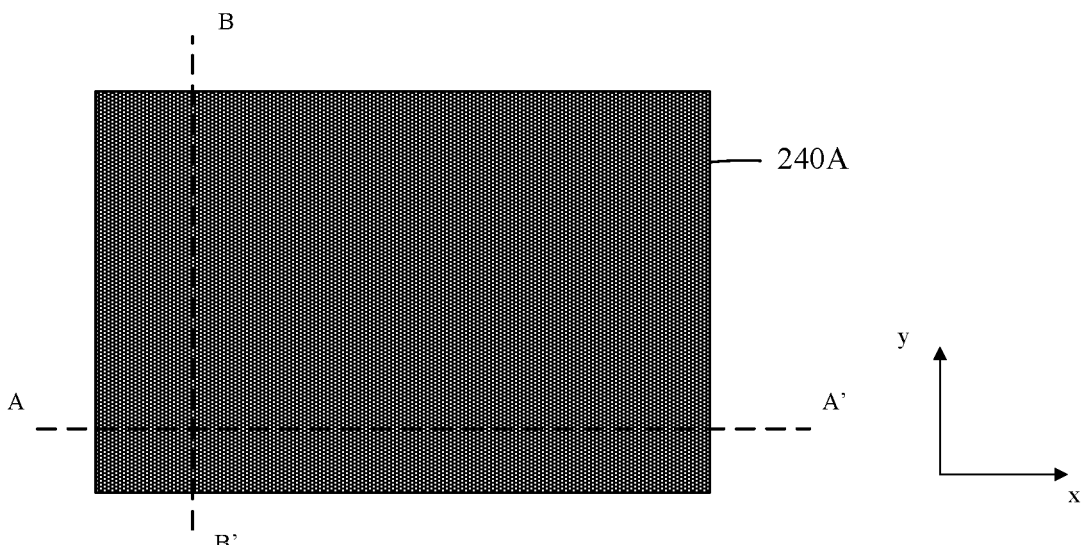
Figure 7B:
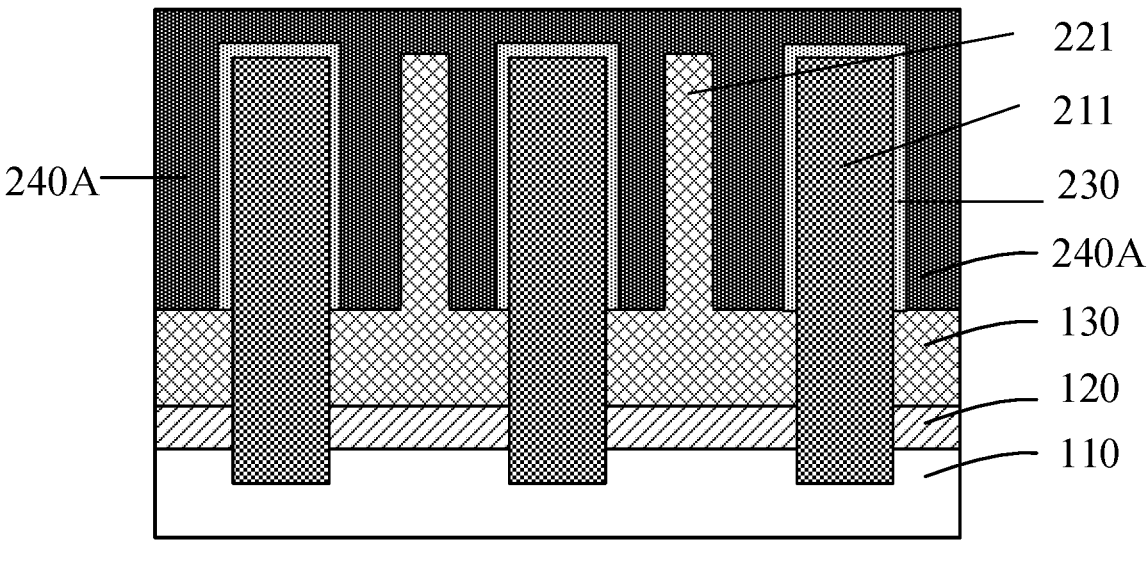
Figure 7C:
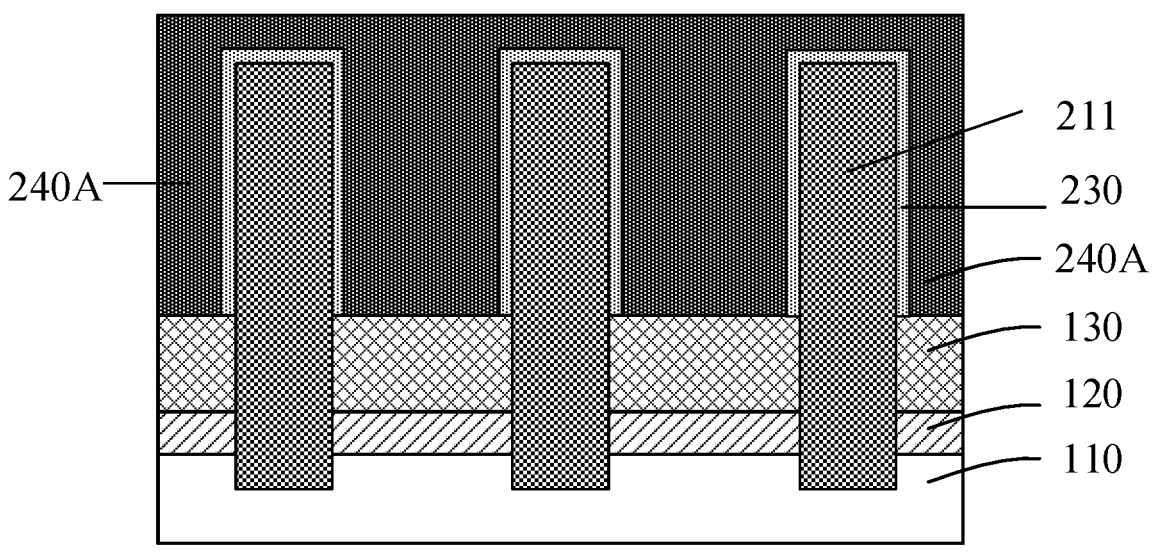

FIGS. 7A-7C schematically show a next stage in the fabrication process of the memory device. FIG. 7A is a top view, FIG. 7B is a cross-sectional view along A-A' line in FIG. 7A, and FIG. 7C is a cross-sectional view along B-B' line in FIG. 7A. As shown in FIGS. 7A-7C, a gate dielectric layer 230 is formed at a top surface and a sidewall of each of the channel layers 211. In some embodiments, the gate dielectric layers 230 can include a dielectric material, such as silicon oxide, and can be formed by, e.g., oxidizing exposed portions (such as exposed sidewalls and top surfaces) of the channel layers 211 via thermal oxidization, or depositing the dielectric material on the exposed portions of the channel layers 211. In some other embodiments, the gate dielectric layers 230 can include another dielectric material, or can be a composite layer including two or more dielectric films.

A gate material can be deposited to fill the trenches 225 to form a gate material layer 240A. In some embodiments, as shown in FIGS. 7A-7C, the gate material can also cover the top surface of the entire structure and hence is a continuous layer across the entire structure. The gate material can include a conductive material, such as polysilicon or metal, and the metal can include, e.g., tungsten, and can be deposited by, e.g., PVD, CVD, or ALD.

Figure 8A:
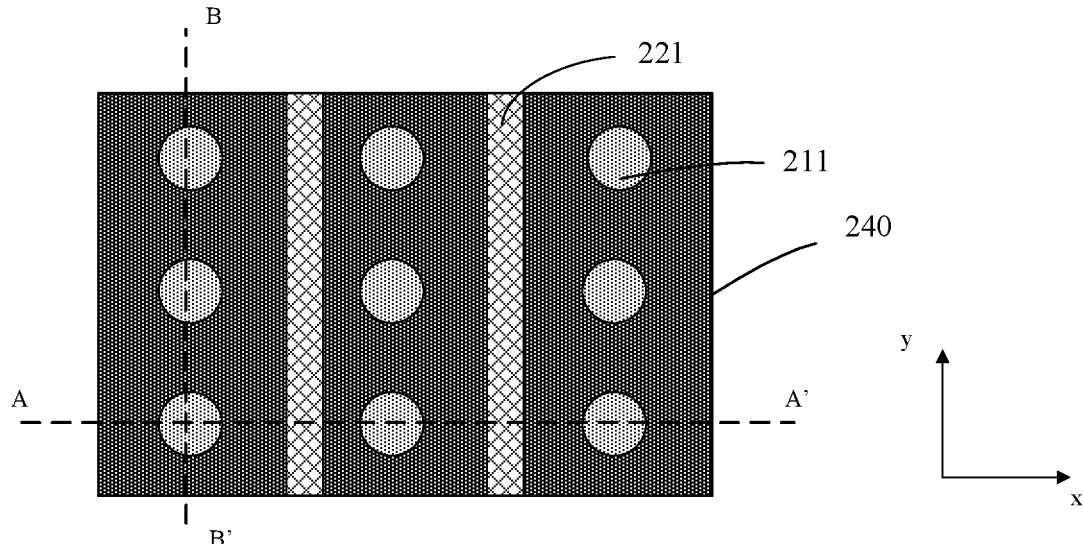
Figure 8B:
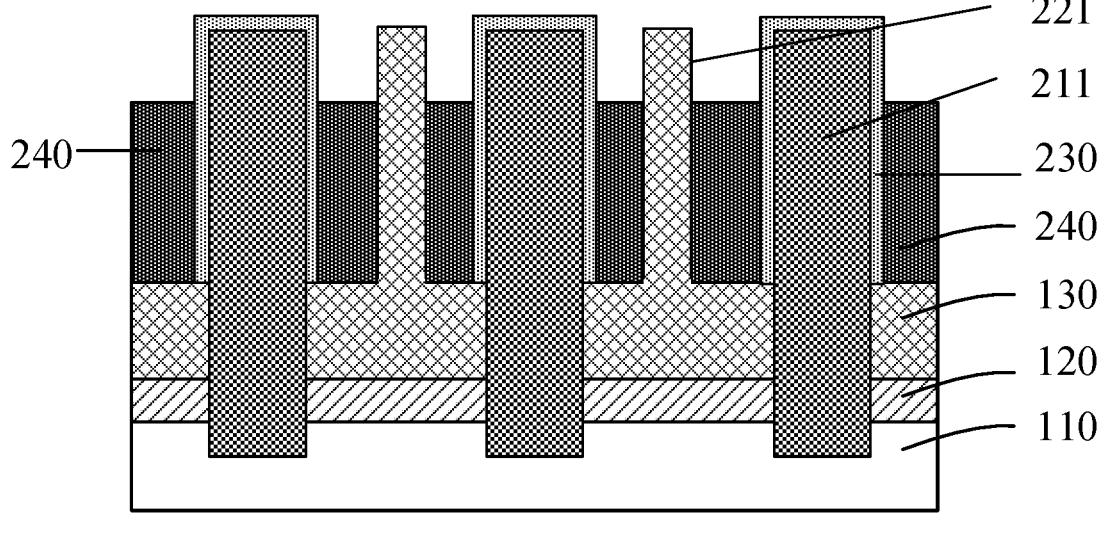
Figure 8C:
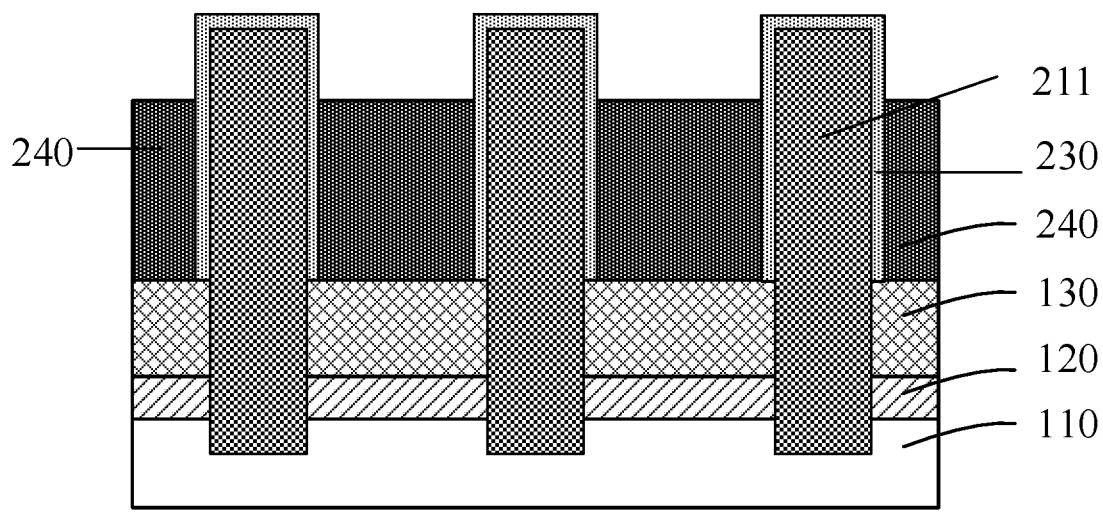

FIGS. 8A-8C schematically show a next stage in the fabrication process of the memory device. FIG. 8A is a top view, FIG. 8B is a cross-sectional view along A-A' line in FIG. 8A, and FIG. 8C is a cross-sectional view along B-B' line in FIG. 8A. As shown in FIGS. 8A-8C, portions of the gate material above the channel layers 211 and the spacers 221 are removed to form a plurality of gate layers 240. In some embodiments, as shown in FIGS. 8A-8C, portions of the gate material surrounding the channel layers 211 (e.g., surrounding top portions of sidewalls of the channel layers 211) are also removed so that top surfaces of the gate layers 240 are lower than the top surfaces of the channel layers 211 and the top surfaces of the spacers 221. As a result, portions of the gate dielectric layers 230 covering the sidewalls of the channel layers 211 and portions of the sidewalls of the spacers 221 can be exposed. The removal of the portions of the gate material can be performed by etching or by CMP followed by etching.

The dielectric layer 230 surrounding the sidewall of a channel layer 211 and corresponding portion of a gate layer 240 surrounding the sidewall of the channel layer 211 can form a gate structure. Each channel layer 211 and the gate structure surrounding thereof can form a transistor of a memory unit. As can be seen from FIG. 8A, the gate layers 240 for each column of channel layers 211 along the second direction (the word line direction) are connected to each other to form a continuous conductive line, and hence can be regarded as one gate layer 240. The plurality of conductive lines can be approximately parallel to each other and arranged along the first direction (the bit line direction). Each of the plurality of conductive lines can extend along the second direction (the word line direction).

As shown in FIG. 8A, because part of the gate material is removed to expose the spacers 221 that extend in the second direction (the word line direction), the gate layers 240 become noncontinuous in the first direction (the bit line direction) but remain continuous in the second direction. Consistent with the disclosure, the trenches 225 are open from the top (i.e., the space surrounding a channel layer 211 is not covered from the top of the space), and the gate layers 240 are formed by depositing the gate material into the trenches 225 from the top to fill the trenches 225, and then removing portions of the deposited gate material. The word "top" used here is to be understood with the orientation as shown in, e.g., FIGS. 8B and 8C, and refers to a side distal from (away from) the substrate 110. For example, the top of a trench 225 is a side of the trench 225 distal from the substrate 110, and the top of the space surrounding a channel layer 211 is a side of the space surrounding the channel layer 211 distal from the substrate 110.

Compared to the conventional method in which the space surrounding a channel layer is covered from the top and precursors for forming a gate layer have to reach the channel layer from the side thereof to deposit or grow gate material on a sidewall of the channel layer, the method consistent with the disclosure to form the gate layers 240 by depositing gate material from the top to fill the trenches 225 can more easily form a continuous gate material layer without breakings. The deposition difficulty is reduced and the quality of deposited gate material layer is improved. Therefore, the formed gate layers 240 can have a high continuity in the word line direction, resulting in less likelihood of breaking or high resistance in the word line (less high-resistant regions). Consequently, resistive-capacitive delay (RC delay) can be reduced and the performance of the final device can be improved, and the impact of non-uniformity in resistivity on the device performance can be reduced. Further, in the conventional method, neighboring gate layers in the bit line direction are separated by voids, i.e., are merely spatially spaced apart from each other without solid structure therebetween, thus the process of forming the gate layers from the side of the channel layers needs to be carefully controlled to avoid contact between neighboring gate layers in the bit line direction, and such contact often occurs. In contrast, in the method consistent with the disclosure, because neighboring gate layers 240 in the bit line direction are separated by the spacers 221, undesired connection or contact between neighboring gate layers 240 can be more easily avoided, which further simplifies the process and improves the performance of the final device.

Figure 9A:
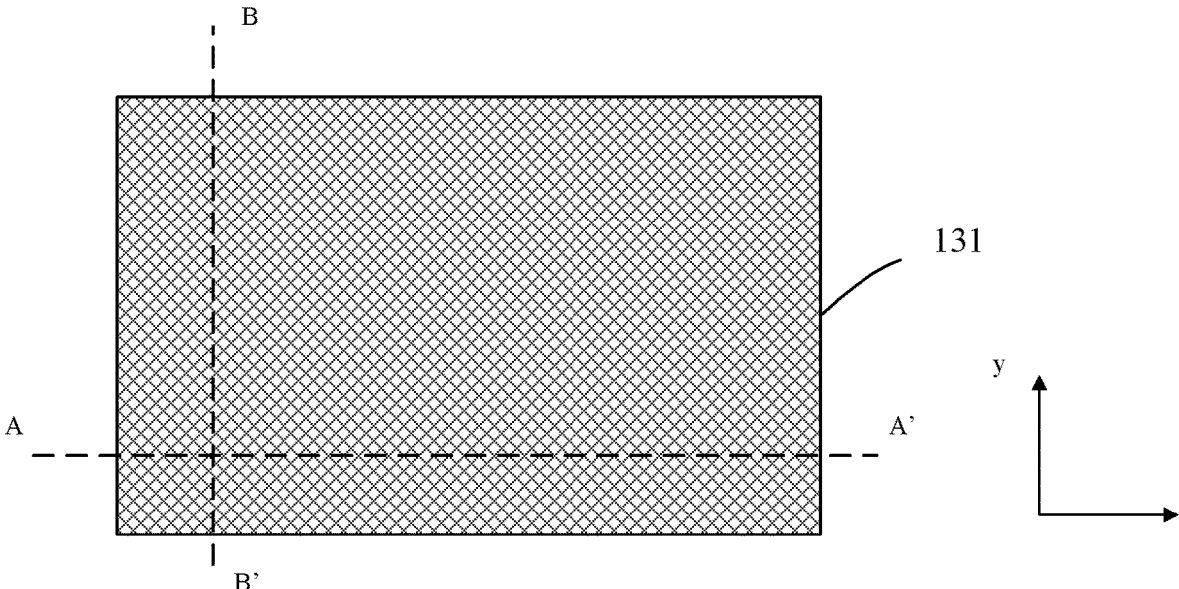
Figure 9B:
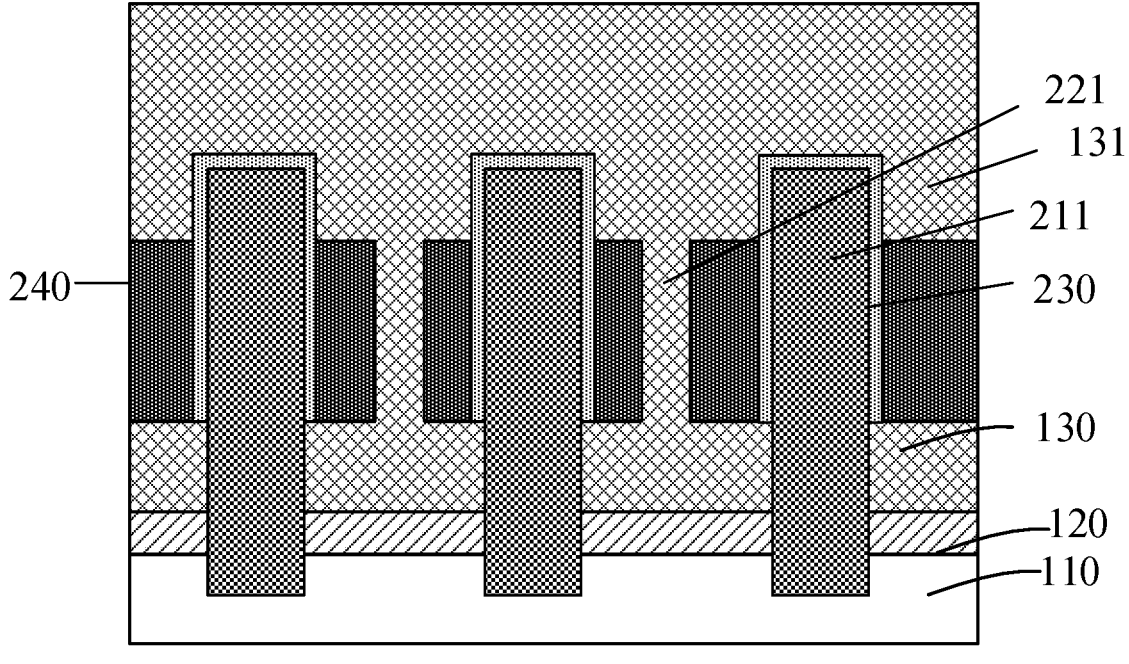
Figure 9C:
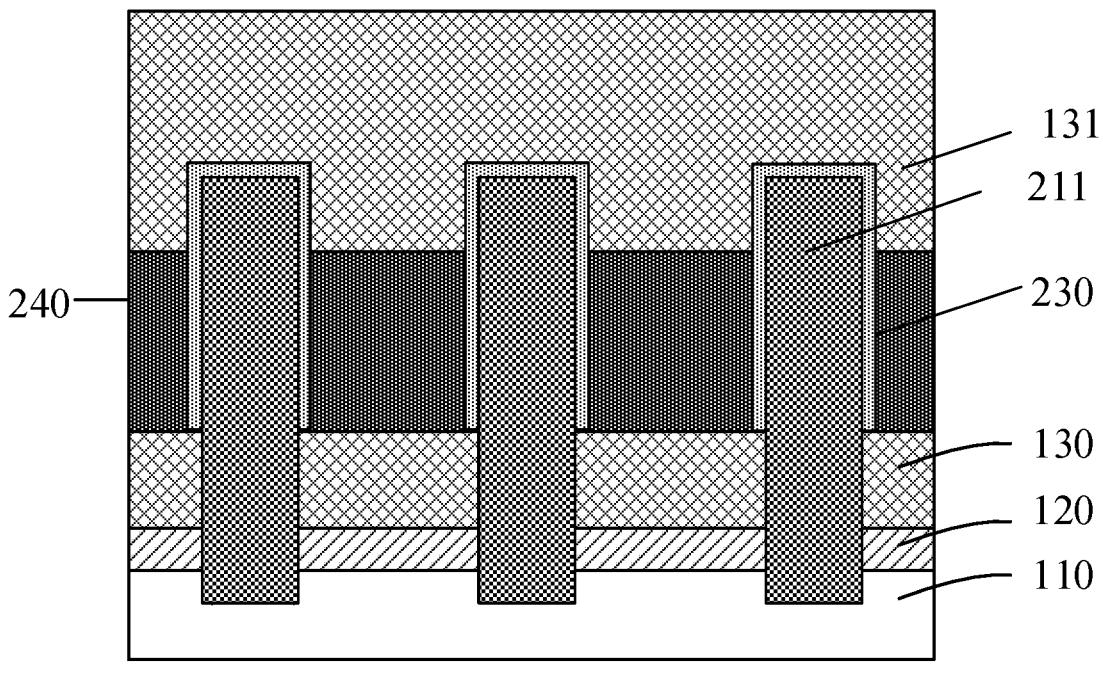

FIGS. 9A-9C schematically show a next stage in the fabrication process of the memory device. FIG. 9A is a top view, FIG. 9B is a cross-sectional view along A-A' line in FIG. 9A, and FIG. 9C is a cross-sectional view along B-B' line in FIG. 9A. In some embodiments, a second insulation layer 131 is formed to cover the top surfaces of the gate layers 240 and the top surfaces of the gate dielectric layers 230, the exposed portions of the side surfaces of the channel layers 211, and the exposed portion of the side surfaces of the spacers 221. In some embodiments, the second insulation layer 131 can be made of a material same as the material for the first insulation layer 130, such as silicon oxide, and can be formed by, e.g., a PVD method, a CVD method, or an ALD method. In some embodiments, a planarization process, such as etching or CMP, can be performed to planarize the second insulation layer 131. In some embodiments, the planarization process can be performed to the extent that a top surface of the second insulation layer 131 can be flush with the top surfaces of the gate dielectric layers 230 as well as the top surfaces of the channel layers 211. In some other embodiments, the top surface of the second insulation layer 131 can be higher or lower than the tope surfaces of the gate dielectric layers 230 and the top surfaces of the channel layers 211. In some embodiments, after the planarization process, additional insulation material can be further deposited to increase the thickness of the planarized second insulation layer 131, resulting in the final second insulation layer 131 shown in FIGS. 9A-9C.

Figure 10A:
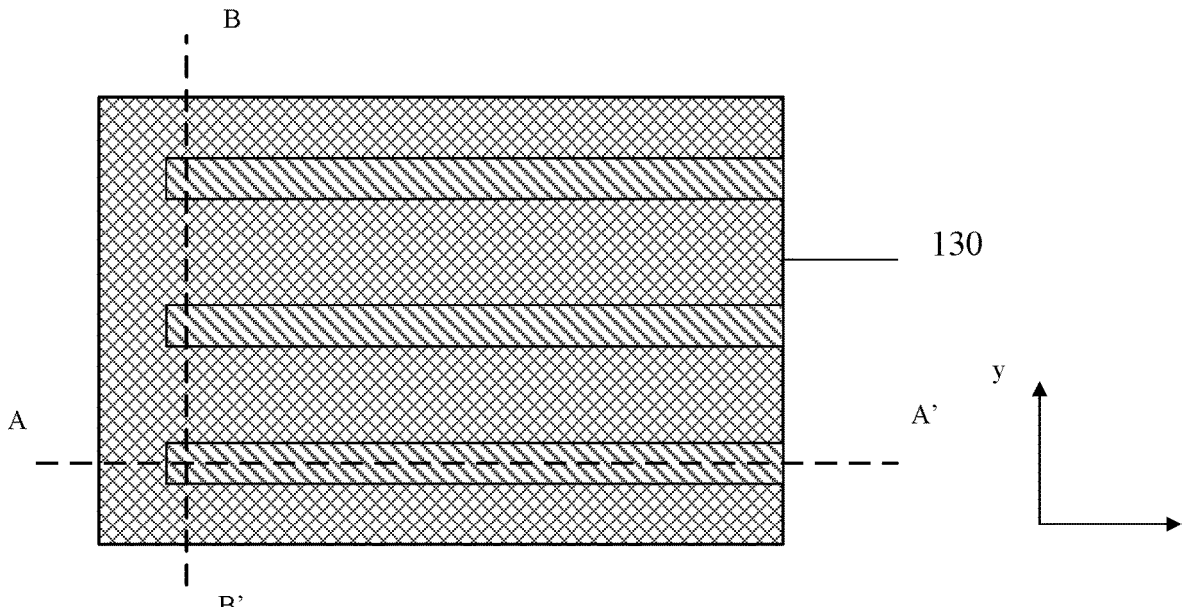
Figure 10B:
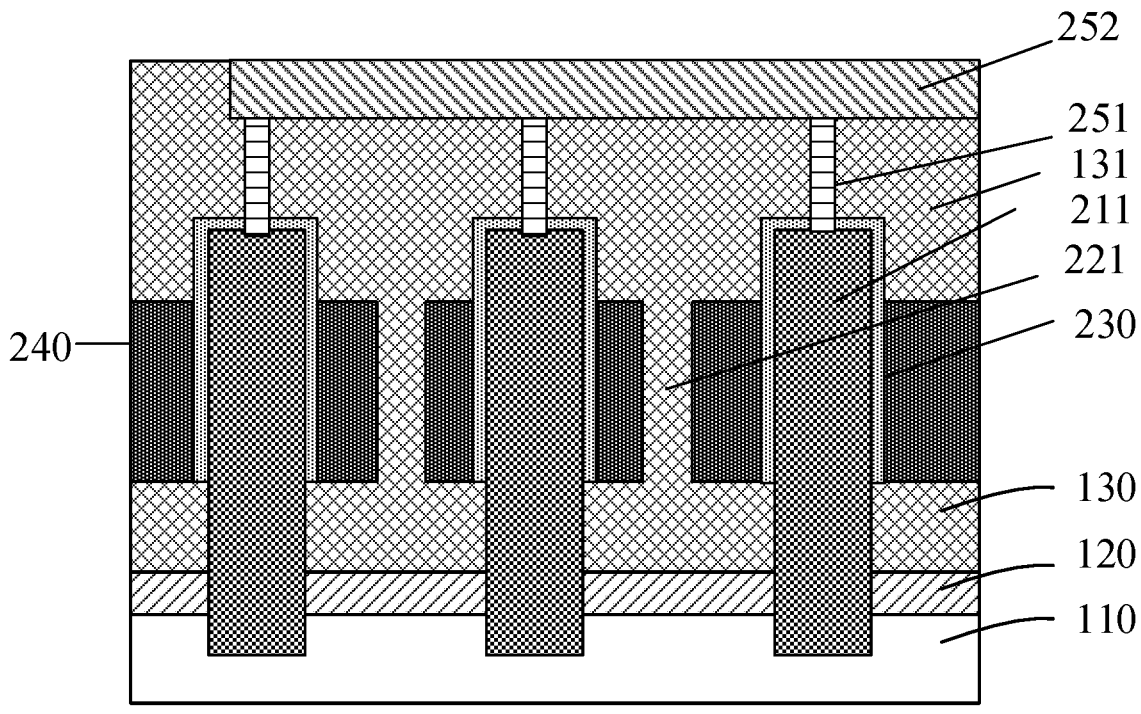
Figure 10C:
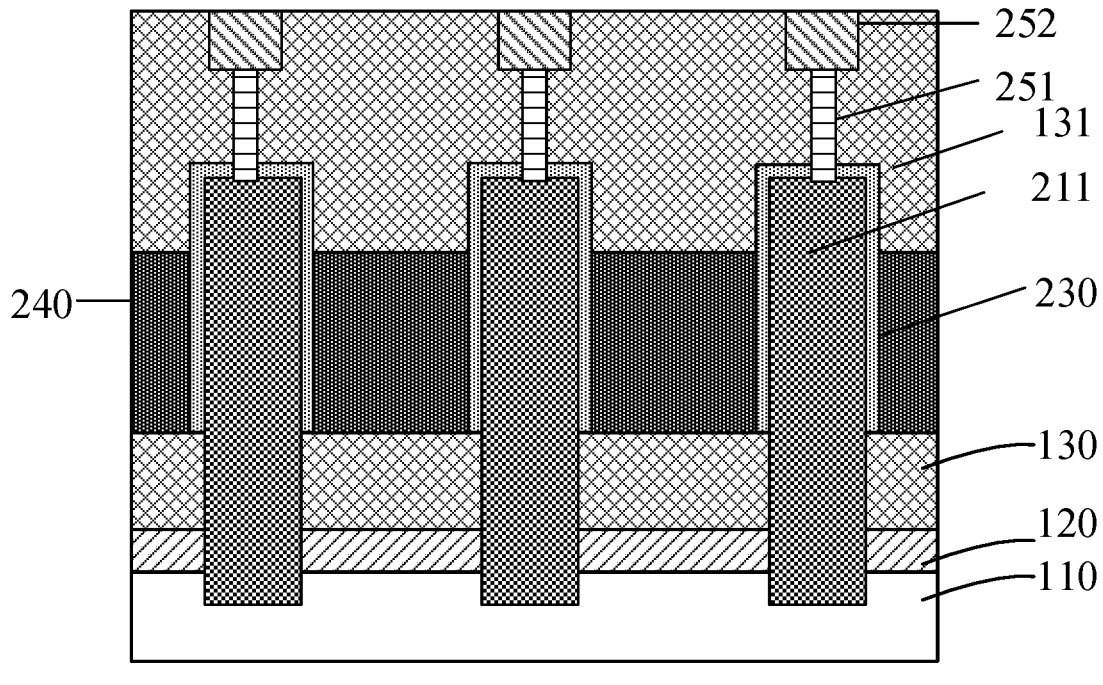

FIGS. 10A-10C schematically show a next stage in the fabrication process of the memory device. FIG. 10A is a top view, FIG. 10B is a cross-sectional view along A-A' line in FIG. 10A, and FIG. 10C is a cross-sectional view along B-B' line in FIG. 10A. As shown in FIGS. 10B and 10C, a first conductive structure 251 is formed on the top surface of each of the channel layers 211, and a second conductive structure 252 is formed on top surfaces of each row of first conductive structures 251. The second conductive structures 252 are arranged along the second direction and each second conductive structure 252 extends along the first direction. The second conductive structures 252 can be approximately parallel to each other. Each of the channel layers 211 can be electrically coupled to a corresponding one of the first conductive structures 251. One row of first conductive structures 251 corresponding to one row of channel layers 211 can be electrically coupled to a corresponding second conductive structure 252. The first conductive structures 251 and the second conductive structures 252 can be embedded in the second insulation layer 131.

The first conductive structures 251 and the second conductive structures 252 can be formed by various suitable methods. In some embodiments, a plurality of holes for the first conductive structures 251 can be formed in the second insulation layer 131 by photolithography and etching to expose portions of the channel layer 211, and then a plurality of trenches for the second conductive structures 252 can be formed in the second insulation layer 131 by photolithography and etching; or the plurality of trenches for the second conductive structures 252 can be formed first and the plurality of holes for the first conductive structures 251 can then be formed in the trench and into the second insulation layer 131 to expose portions of the channel layer 211. Once the holes and trenches are formed, a conductive material can be formed therein to form the first conductive structures 251 and the second conductive structures 252 together. In some other embodiments, one of the first conductive structures 251 and the second conductive structures 252 can be formed first by photolithography/etching and filling corresponding conductive material and the other one of the first conductive structures 251 and the second conductive structures 252 can be then formed by photolithography/etching and filling corresponding conductive material.

Each of the first conductive structures 251 and the second conductive structures 252 can be made of a conductive material, such as polysilicon or metal, and the metal can include copper, aluminum, tungsten, or a combination thereof. The conductive material for the first conductive structures 251 can be the same or different from the conductive material for the second conductive structures. For example, the first conductive structures 251 and the second conductive structures 252 can be made of tungsten.

Figure 11A:
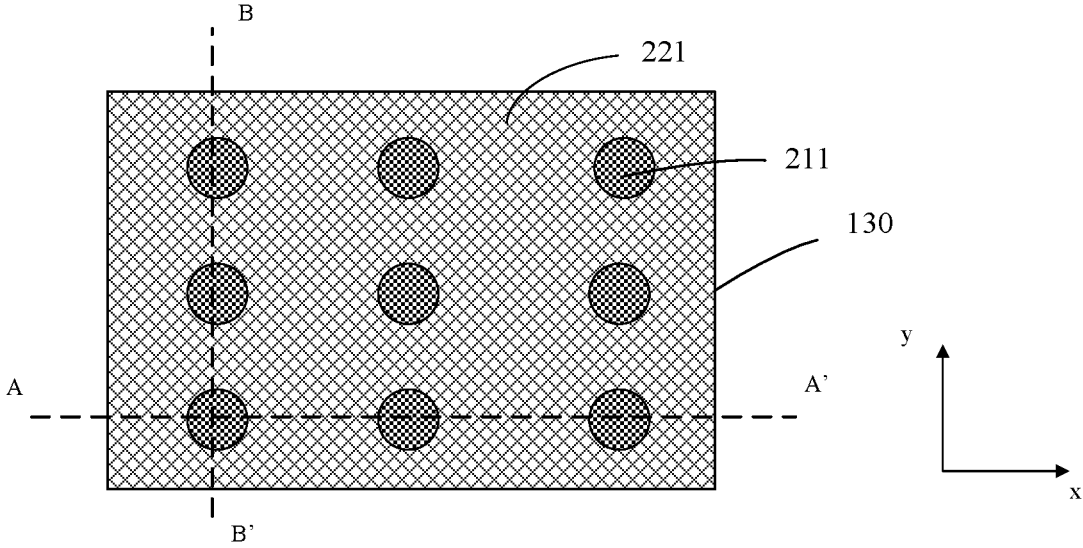
Figure 11B:
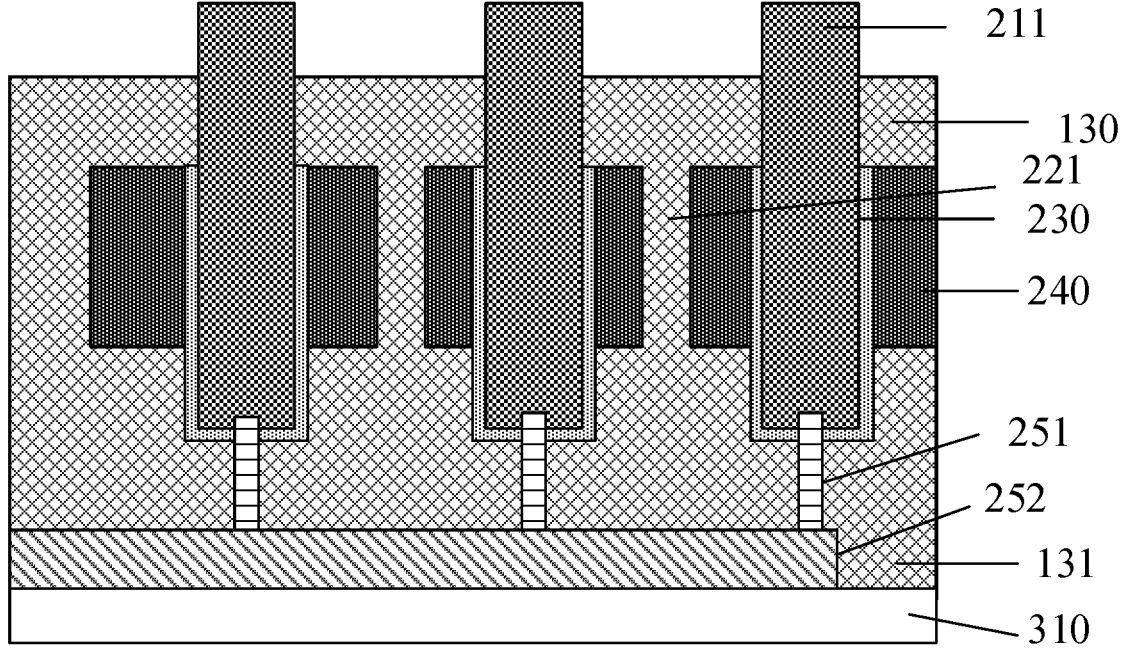
Figure 11C:
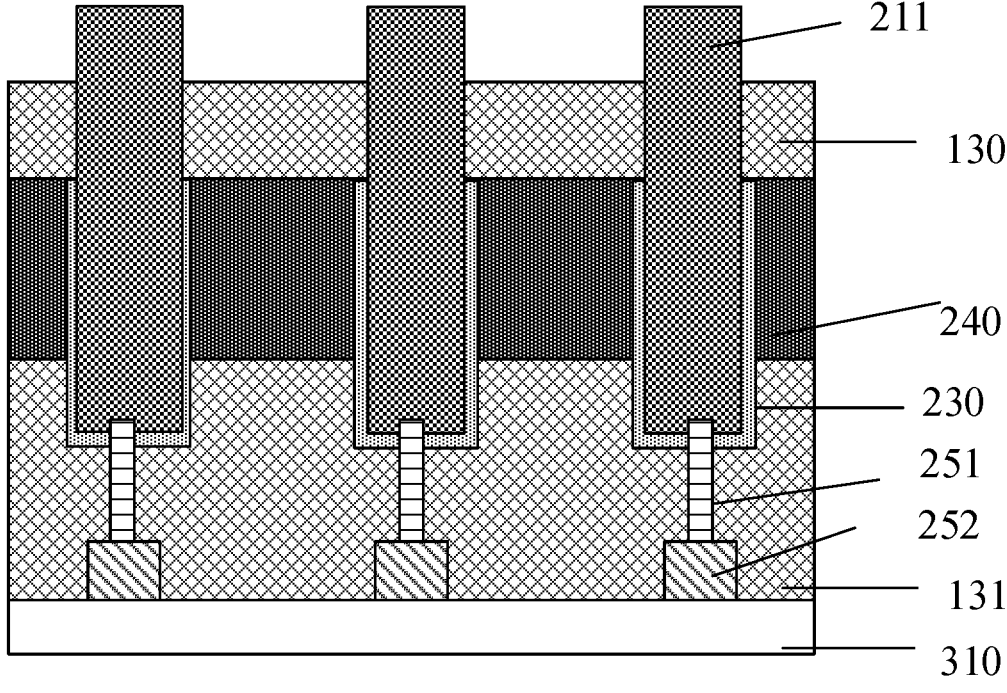

FIGS. 11A-11C schematically show a next stage in the fabrication process of the memory device. FIG. 11A is a top view, FIG. 11B is a cross-sectional view along A-A' line in FIG. 11A, and FIG. 11C is a cross-sectional view along B-B' line in FIG. 11A. Consistent with the disclosure, after the first conductive structures 251 and the second conductive structures 252 are formed, the entire wafer (the wafer formed so far is also referred to as an "intermediate wafer") is flipped and bonded to a second substrate 310, also referred to as a "carrier substrate." After the wafer is bonded to the second substrate 310, the second conductive structures 252 and the second insulation layer 131 are proximal to the second substrate 310 (as shown in FIGS. 11B and 11C), while the first substrate 110 is distal from the second substrate 310. In some embodiments, an insulation layer can be formed between the second conductive structures 252 and the second substrate 310.

The second substrate 310 can be made of, e.g., an elemental semiconductor material such as silicon or germanium, a semiconductor alloy such as SiGe, a compound semiconductor material such as SiC, InP, GaAs, GaP, InAs, InSb, InGaAs, or InGaAsP, or a composite material such as silicon-on-insulator (SOI) or germanium-on-insulator (GOI), or a combination of any of the above materials.

After the wafer is bonded to the second substrate 310, the first substrate 110 and the first sacrificial layer 120 are removed such that a portion of the sidewall of each of the channel layers 211 and a top surface (which would be a bottom surface in FIGS. 2A-10C) of each channel layer 211 away from the corresponding first conductive structure 251 are exposed, as shown in FIGS. 11A-11C. The first substrate 110 and the first sacrificial layer 120 can be removed by a CMP method and/or an etch method.

Figure 12A:
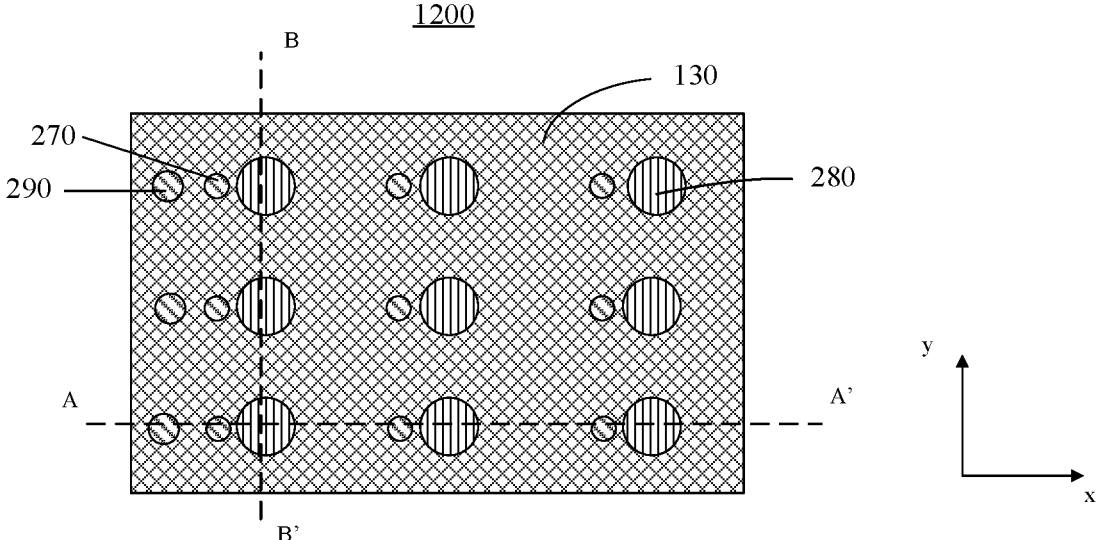
Figure 12B:
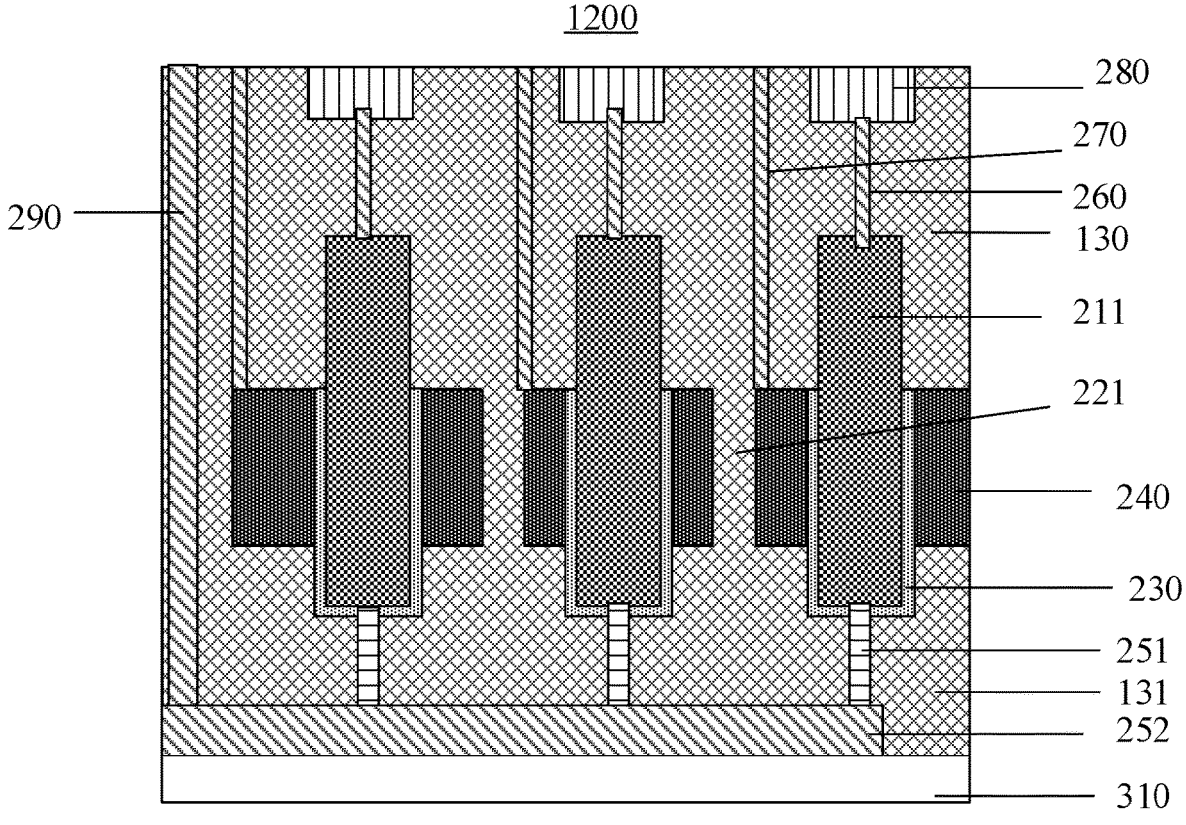
Figure 12C:
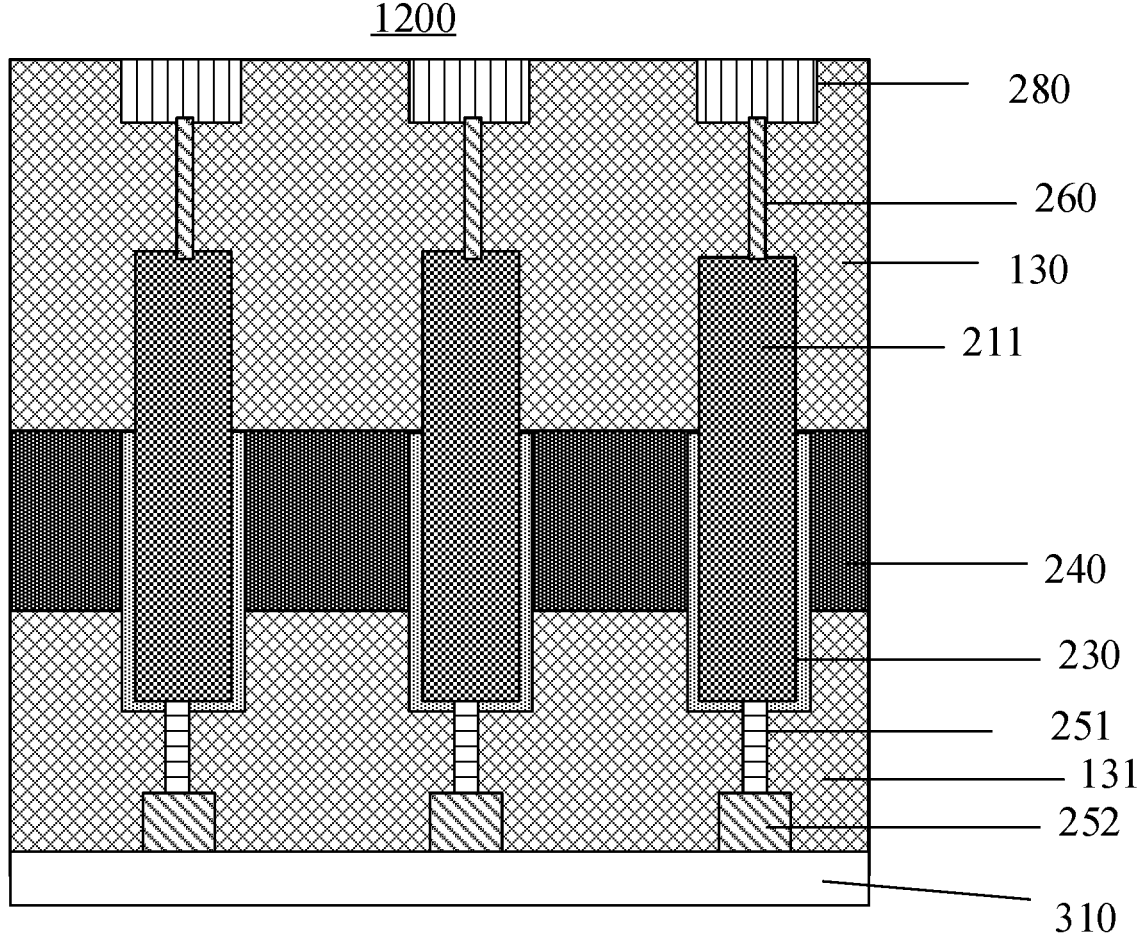

FIGS. 12A-12C schematically show a next stage in the fabrication process of the memory device. FIG. 12A is a top view, FIG. 12B is a cross-sectional view along A-A' line in FIG. 12A, and FIG. 12C is a cross-sectional view along B-B' line in FIG. 12A. In some embodiments, after the channel layers 211 are exposed by removing the first substrate 110 and the first sacrificial layer 120, the first insulation layer 130 can be thickened by depositing an insulation material same as that of the first insulation layer 130, to cover exposed portions of the channel layers. Then, as shown in FIGS. 12A-12C, a first lead-out (pick-up) structure 260 is formed on a top surface of each of the channel layers 211 away from the second substrate 310, and a second lead-out structure 270 is formed on the gate structure of each of the channel layers 211. Each second lead-out structure 270 can be electrically coupled to the gate layer 240 of a corresponding one of the channel layers 211. Each first lead-out structure 260 can be electrically coupled to a corresponding one of the channel layers 211. In the example shown in FIG. 12A, a plurality of second lead-out structures 270 are arranged in a column along the second direction and each corresponds to one of the column of channel layers 211 in the second direction. This is not necessarily the case since each gate layer 240 is continuous along the second direction. In some embodiments, more or less second lead-out structures 270 can be arranged in a column along the second direction. In some embodiments, one second lead-out structure 270 can be provided for each gate layer 240 and, like the gate layer 240, the one second lead-out structure 270 can extend continuously along the second direction.

The first lead-out structures 260 and the second lead-out structures 270 can be made of a conductive material such as polysilicon or metal, and the metal can include copper, aluminum, tungsten, or a combination thereof. In some embodiments, the first lead-out structures 260 and the second lead-out structures 270 can be made of tungsten.

A storage capacitor 280 is formed on a top of the first lead-out structure 260 corresponding to each of the channel layers 211. The storage capacitor 280 can include a first electrode, a second electrode, and a dielectric layer between the first electrode and the second electrode. For each storage capacitor, the first electrode can be electrically coupled to a corresponding first lead-out structure 260 and the second electrode can be connected to the ground.

Further, a plurality of third lead-out structures 290 are formed in the second insulation layer 131. The plurality of third lead-out structures 290 can be arranged along the second direction. Each of the plurality of third lead-out structures 290 can be electrically coupled to a corresponding one of the second conductive structures 252. The plurality of third lead-out structures 290 can be made of a conductive material such as polysilicon or metal, and the metal can include copper, aluminum, tungsten, or a combination thereof. In some embodiments, the plurality of third lead-out structures 290 can be made of tungsten.

The first lead-out structures 260, the second lead-out structures 270, and the storage capacitors 280 can be embedded in the first insulation layer 130. The third lead-out structures 290 can be embedded in the first insulation layer 130 and the second insulation layer 131.

Other processes for forming the final memory device, such as wiring and packaging, can be further performed, descriptions of which are omitted here.

The present disclosure also provides a memory device. FIG. 12A is a top view of a portion of a memory device 1200 consistent with the present disclosure. FIG. 12B is a cross-sectional view along A-A' line in FIG. 12A, and FIG. 12C is a cross-sectional view along B-B' line in FIG. 12A. As shown in FIGS. 12A-12C, the memory device 1200 includes the second substrate 310, the second insulation layer 131 over the second substrate 310, the second conductive structures 252, the first conductive structures 251, the third lead-out structures 290, the channel layers 211, the gate structures each including a gate dielectric layer 230 and a gate layer 240, the spacers 221, the first lead-out structures 260, the second lead-out structures 270, the first insulation layer 130, and the storage capacitors 280.

The second conductive structures 252 are disposed over the second substrate 310 and in the second insulation layer 131. The second conductive structures 252 are arranged along the first direction (bit line direction of the memory device 1200) and extend along the second direction (word line direction of the memory device 1200). The first direction can be perpendicular to the second direction. The second conductive structures 252 are approximately parallel to each other.

The first conductive structures 251 can be arranged in an array along the first direction and the second direction. The channel layers 211 can be also arranged in an array along the first direction and the second direction and correspond to the first conductive structures 251 in a one-to-one correspondence. Each first conductive structure 251 can be electrically coupled to a corresponding one of the channel layers 211. The first conductive structures 251 corresponding to each row of channel layers 211 can be electrically coupled to a corresponding second conductive structure 252. The first conductive structures 251 and the second conductive structures 252 can be embedded in the second insulation layer 131.

Each of the channel layers 211 is over a top surface of a corresponding first conductive structure 251 and embedded in the first insulation layer 130.

Each gate structure is formed at a sidewall of each of the channel layers 211. Each gate structure includes a gate dielectric layer 230 at the sidewall of a corresponding one of the channel layers 211 and a gate layer 240 at a sidewall of the gate dielectric layer 230. The gate layers 240 for each column of channel layers 211 along the second direction (the word line direction) are connected to each other to form a continuous conductive line. The gate layers 240 for each column of channel layers 211 along the first direction (the bit line direction) are separated from each other by a spacer 221. The plurality of conductive lines can be approximately parallel to each other and arranged along the first direction (the bit line direction). Each of the plurality of conductive lines can extend along the second direction (the word line direction).

Each first lead-out structure 260 is arranged over a top surface of each of the channel layers 211 away from the second substrate 310, and each second lead-out structure 270 is formed over the gate structure of each of the channel layers 211. Each second lead-out structure 270 can be electrically coupled to the gate layer 240 of a corresponding one of the channel layers 211. Each first lead-out structure 260 can be electrically coupled to a corresponding one of the plurality of channel layers 211.

Each storage capacitor 280 is arranged over a top of the first lead-out structure 260 of each of the channel layers 211. Each storage capacitor 280 can include a first electrode, a second electrode, and a dielectric layer between the first electrode and the second electrode. The first electrode and the second electrode can be electrically coupled to a corresponding first lead-out structure 260 and the ground, respectively.

The third lead-out structures 290 are arranged over the second conductive structures 252 and embedded in the first insulation layer 130 and the second insulation layer 131. The third lead-out structures 290 can be arranged along the second direction. Each of the plurality of third lead-out structures 290 can be electrically coupled to a corresponding one of the second conductive structures 252.

The first lead-out structures 260, the second lead-out structures 270, and the storage capacitors 280 can be embedded in the first insulation layer 130. The first conductive structures 251, the second conductive structures 252, the first lead-out structures 260, the second lead-out structures 270, and the third lead-out structures 290 can form an interconnect structure electrically coupling, for example, different components of the memory device 1200, such as the gate layers 240 of the transistors and electrodes of the storage capacitors 280.

For characteristics of each component of the memory device 1200 that are not explicitly described, reference can be made to the description above regarding the fabrication process of the memory device.

Consistent with the disclosure, the gate layers of the memory device are formed after the spacers are formed and the second sacrificial layer is removed, sufficient amount of gate material can be deposited to ensure the continuity of the formed word lines without the worry that the gate layers are connected in the bit line direction. As a result, for example, the RC delay of the memory device can be reduced and the performance of the memory device can be improved.

Figure 13:
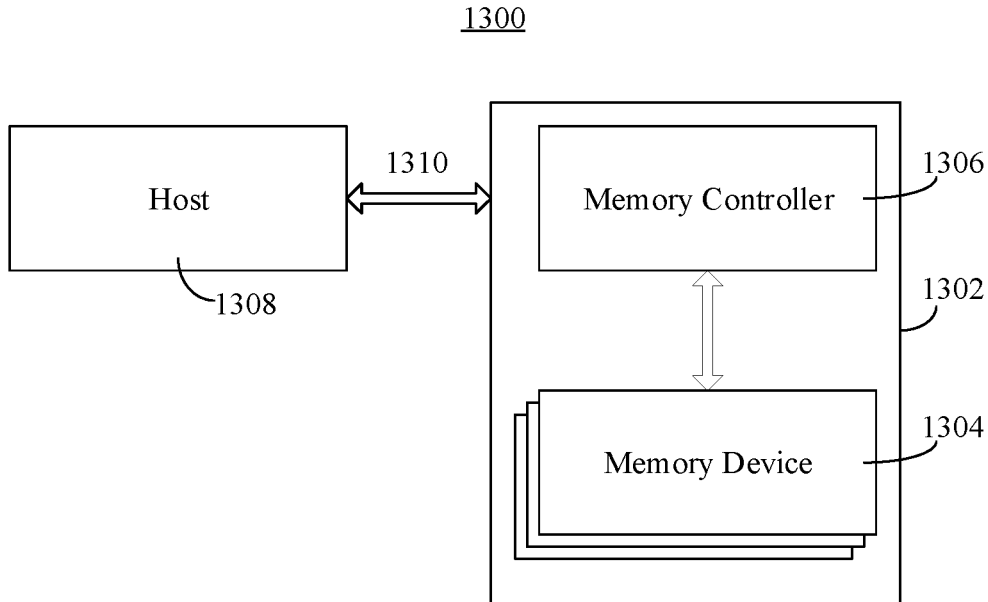
FIG. 13 is a block diagram of an example system consistent with the disclosure.

FIG. 13 is a block diagram of an example system 1300 having a memory device consistent with the disclosure. The system 1300 can be a mobile phone (e.g., a smartphone), a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic device having storage therein. As shown in FIG. 13, the system 1300 includes a memory system 1302 having one or more memory devices 1304 and a memory controller 1306. The system 1300 further includes a host 1308. The host 1308 can be a processor of an electronic device, such as a central processing unit (CPU), or a system-on-chip (SoC), such as an application processor (AP). The host 1308 can be configured to send or receive data to or from the one or more memory devices 1304. Each of the one or more memory devices 1304 can include a memory device consistent with the disclosure, such as one of the example memory devices described above.

The memory controller 1306 is coupled to the one or more memory devices 1304 and the host 1308, and is configured to control operation of the one or more memory devices 1304, according to some implementations. The memory controller 1306 can also be integrated into the one or more memory devices 1304. The memory controller 1306 can manage the data stored in the one or more memory devices 1304 and communicate with the host 1308 via an interface 1310. In some embodiments, the memory controller 1306 is designed for operating in a low duty-cycle environment, such as a secure digital (SD) card, a compact Flash (CF) card, a universal serial bus (USB) Flash drive, or another medium for use in electronic devices, such as personal computers, digital cameras, mobile phones, etc. In some other embodiments, the memory controller 1306 is designed for operating in a high duty-cycle environment, such as a solid-state drive (SSD) or an embedded multi-media-card (eMMC) used as data storage for mobile devices, such as smartphones, tablets, laptop computers, etc., and enterprise storage arrays. The memory controller 1306 can be configured to control operations of the one or more memory devices 1304, such as read, erase, and program operations.

Figure 14:
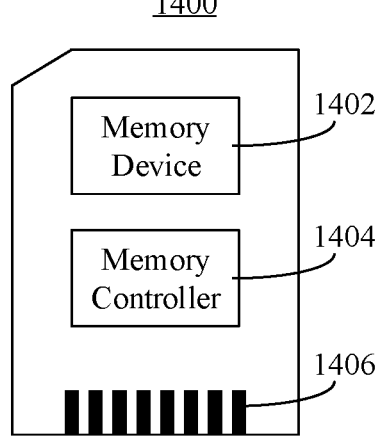
FIG. 14 is a block diagram of an example memory card consistent with the disclosure.
Figure 15:
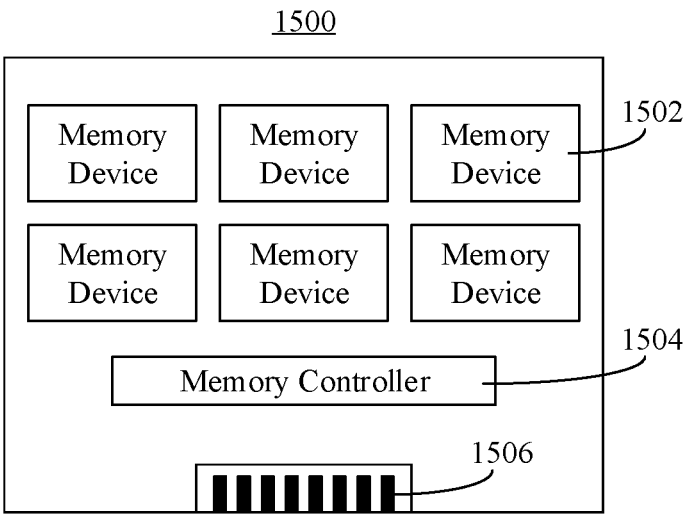
FIG. 15 is a block diagram of an example solid-state drive consistent with the disclosure.

The memory controller 1306 and the one or more memory devices 1304 can be integrated into various types of storage devices, for example, be included in the same package, such as a universal Flash storage (UFS) package or an eMMC package. That is, the memory system 1302 can be implemented and packaged into different types of end electronic products. FIGS. 14 and 15 are block diagrams of an example memory card 1400 and an example SSD 1500, respectively, consistent with the disclosure. As shown in FIG. 14, a single memory device 1402 and a memory controller 804 are integrated into the memory card 1400. The memory device 1402 can include a memory device consistent with the disclosure, such as one of the above-described example memory devices. The memory card 1400 can include a PC card (personal computer memory card international association (PCMCIA)), a CF card, a smart media (SM) card, a memory stick, a multimedia card (MMC, RS-MMC, or MMCmicro), an SD card (SD, miniSD, microSD, or SDHC), a UFS, etc. As shown in FIG. 14, the memory card 1400 further includes a memory card interface or interface connector 1406 configured to couple the memory card 1400 to a host (e.g., the host 1308 shown in FIG. 13).

As shown in FIG. 15, multiple memory devices 1502 and a memory controller 1504 are integrated into the SSD 1500. Each of the memory devices 1502 can include a memory device consistent with the disclosure, such as one of the above-described example memory devices. As shown in FIG. 15, the SSD 1500 further includes an SSD interface or interface connector 1506 configured to couple the SSD 1500 to a host (e.g., the host 1308 shown in FIG. 13).

Although the principles and implementations of the present disclosure are described by using specific embodiments in the specification, the foregoing descriptions of the embodiments are only intended to help understand the idea of the present disclosure. A person of ordinary skill in the art can make modifications to the specific implementations and application range according to the idea of the present disclosure. For example, one or more components of the disclosed memory device can be omitted or one or more components not explicitly described above can be added to the memory device. Similarly, one or more steps in the fabrication process of the memory device can be omitted or one or more steps not explicitly described above can be included in the fabrication process. The content of the specification should not be construed as a limitation to the present disclosure.

What is claimed is:

1. A memory device comprising:

a substrate;

a plurality of channel layers formed over the substrate and forming an array expanding in a first direction and a second direction different from each other, and the first direction and the second direction being parallel to a surface of the substrate;

a plurality of gate dielectric layers each surrounding, and covering an end of, one of the channel layers;

a plurality of gate layers arranged along the first direction, each of the gate layers continuously extending approximately along the second direction and surrounding one column of the channel layers; and a plurality of spacers arranged along the first direction, each of the spacers extending approximately along the second direction and separating neighboring ones of the gate layers, wherein, in the first direction, the gate layers are separated by the spacers and formed between the spacers, and surround the channel layers through the gate dielectric layers; and, in the second direction, the gate layers extend without separation by the spacers and surround the channel layers through the gate dielectric layers.

2. The memory device of claim 1, further comprising:

a plurality of storage capacitors;

a first lead-out structure arranged over a top surface of each of the channel layers and formed over the gate structure of each of the channel layers;

a second lead-out structure electrically coupled to the gate layer of a corresponding one of the channel layers to form a word line; and a third lead-out structure forming an interconnect structure electrically coupling the channel layers, the gate layers, and the storage capacitors.

3. The memory device of claim 2, wherein:

each of the storage capacitors includes a first electrode, a second electrode, and a dielectric layer between the first electrode and the second electrode, the second electrode being electrically coupled to ground; and the interconnect structure includes:

a plurality of first lead-out structures each electrically coupling the first electrode of one of the storage capacitors to a corresponding one of the channel layers; and a plurality of second lead-out structures each electrically coupled to one of the gate layers.

4. A memory system comprising:

a memory device including:

a substrate;

a plurality of channel layers formed over the substrate and forming an array expanding in a first direction and a second direction different from each other, and the first direction and the second direction being parallel to a surface of the substrate;

a plurality of gate dielectric layers each surrounding, and covering an end of, one of the channel layers;

a plurality of gate layers arranged along the first direction, each of the gate layers continuously extending approximately along the second direction and surrounding one column of the channel layers; and a plurality of spacers arranged along the first direction, each of the spacers extending approximately along the second direction and separating neighboring ones of the gate layers; and a memory controller coupled to the memory device and configured to control operation of the memory device, wherein, in the first direction, the gate layers are separated by the spacers and formed between the spacers, and surround the channel layers through the gate dielectric layers; and, in the second direction, the gate layers extend without separation by the spacers and surround the channel layers through the gate dielectric layers.

* * * * *